US007379291B2

(12) United States Patent
Quazi

(10) Patent No.: US 7,379,291 B2
(45) Date of Patent: May 27, 2008

(54) ENCLOSED ELECTRONIC BALLAST HOUSING

(75) Inventor: Fazle S. Quazi, Boulder, CO (US)

(73) Assignee: Energy Conservation Technologies, Inc., Boulder, CO (US)

( * ) Notice: Subject to any disclaimer, the term of this patent is extended or adjusted under 35 U.S.C. 154(b) by 464 days.

(21) Appl. No.: 11/238,259

(22) Filed: Sep. 29, 2005

(65) Prior Publication Data

US 2007/0070584 A1 Mar. 29, 2007

(51) Int. Cl.
*H05K 7/20* (2006.01)
*H05B 37/00* (2006.01)

(52) U.S. Cl. ...................... 361/674; 361/714; 362/218; 362/294; 174/50; 174/50.51; 315/32

(58) Field of Classification Search ................ 361/674, 361/676, 679, 704, 709, 710, 714, 715; 174/50, 174/50.51, 53, 54, 58, 61; 362/218, 221, 362/294, 362-373; 315/32, 224, 225, 219, 315/209 R, 244, 247, 291, 307, 308
See application file for complete search history.

(56) References Cited

U.S. PATENT DOCUMENTS 4,729,740 A * 3/1988 Crowe et al. .............. 439/76.1
6,123,435 A * 9/2000 Wang .......................... 362/263
6,290,375 B1 * 9/2001 LeVasseur .................. 362/368
6,565,238 B1 * 5/2003 Pyrtle ......................... 362/373
6,943,502 B2 * 9/2005 Yamanaka et al. .......... 315/224
2006/0268559 A1 * 11/2006 Sferra et al. ................ 362/382

* cited by examiner

*Primary Examiner*—Michael V Datskovskiy
(74) *Attorney, Agent, or Firm*—Patton Boggs LLP

(57) ABSTRACT

The enclosed electronic ballast housing provides improved convection heat transfer for lowering the ambient housing temperature for keeping the junction temperature of power semiconductors inside the enclosed electronic ballast housing within certain specified temperature ranges for long-term reliable operation. The enclosed electronic ballast housing includes at least one folded fin on at least one of the enclosed electronic ballast housing surfaces, the folded fin may be manufactured from the same piece of material as the ballast housing for improved heat transfer. The folded fins are substantially parallel to their respective adjacent surfaces. Additionally, the enclosed electronic ballast housing includes separating portions of heat dissipating sections of ballast circuitry outside of the housing ballast.

32 Claims, 19 Drawing Sheets

NATURAL CONVECTION

THERMAL RESISTANCE VS. SURFACE AREA FOR BLACK ALUMINUM SURFACES.

ENCLOSED ELECTRONIC BALLAST HOUSING

FIELD OF THE INVENTION

This invention relates to an enclosed electronic control ballast housing for lighting fixtures.

PROBLEM

High Intensity Discharge (HID) lighting fixtures have become an industry standard for illuminating large areas, such as airports, warehouses, parking facilities, streetlights, and the like. One estimate shows that approximately eight percent of the world's electricity production is used in HID lighting. HID lighting typically produces greater light and consumes less power than a standard incandescent bulb, while better approximating the color temperature of natural daylight than either incandescent or fluorescent lighting. To operate HID lighting, ballasts are used to supply the proper voltage and control current to two closely spaced electrodes to form an arc discharge within a quartz lamp filled with a gas. The ballasts, lamps, associated circuitry, and electronics are enclosed within a sealed lighting fixture.

HID lighting fixtures have used magnetic ballasts, similar to those used by fluorescent lighting, to provide the voltage and current required by the HID lamps. Magnetic ballasts have a simple core and coil assembly transformer that performs the functions of starting and operating the lamps. Due to their inherent design, magnetic ballasts produce a magnetic humming noise and are inefficient in converting input power to the proper lamp power. In addition, magnetic ballasts are not dimmable and the power line variation does affect the light output, thus the light output of the lamp can fluctuate with varying input power. In an effort to improve the performance of HID lighting, electronic ballasts are starting to be used in place of magnetic ballasts. Some advantages of these electronic ballasts over magnetic ballasts include less weight, less noise, less power consumption, the ability to dim the output lamp, and the ability to regulate the power into the lamp, regardless of the varying input power. In addition, electronic ballast housings are being designed to fit into the footprint of the existing magnetic ballast housings to enable quick replacement of the magnetic ballast of HID and fluorescent lighting fixtures with the quiet and efficient electronic ballast.

However, the switch to electronic ballasts in HID and fluorescent lighting has been tempered due to the substantially higher costs associated with electronic ballasts over the less expensive magnetic ballasts. A significant cause for the higher expense of electronic ballasts is their housings, which are typically produced by extruding or casting plastic or a metal, such as aluminum, into a mold to create the ballast housing. Some of the additional costs associated with extrusion processes include the extra amounts of material required for extrusion, which are ultimately discarded, and the significant costs of the extrusion equipment itself.

In addition, electronic ballasts for HID and fluorescent lamps often must operate in high ambient temperature environments due to their enclosed location within the sealed lighting fixture. The temperature within an enclosed electronic ballast housing is generally created by the sum of the environmental temperature outside the lighting fixture, the heat produced by the lamps within a lighting fixture, and the heat created by the electronic ballast within lighting fixture. The heat produced by a HID lamp can raise temperatures within the sealed lighting fixture in excess of 65° C. In addition, most electronic ballasts are not 100% efficient in converting input power to lamp power, so for example, a 250 W high-pressure sodium (HPS) lamp electronic ballast having a 90% power conversion efficiency may have a loss of 25 W. Based on manufacturer's data, it was found that commercially available standard 250 W HPS lighting fixtures generally accommodate an average maximum height of 5 inches, width of 6 inches, and a depth of 3.5 inches ballast housing, for a total exposed surface area of approximately 137 square inches. From FIG. 3 it can be seen that 137 square inches of surface area offers approximately 1.7° C./W thermal resistance in a natural convection environment. With the power devices mounted to the inside walls of the ballast housing (FIG. 2) the semiconductor junction to ballast case thermal resistance is approximately 1° ° C./W (0.6° C. for junction to device case+0.4° C. for interface material between the device case and the ballast surface). For a given geometry this semiconductor thermal resistance value is constant and must be added to ballast housing thermal resistance value for obtaining the semiconductor junction temperature rise. Based on these assumptions, the thermal resistance of semiconductor junction to ambient is 2.7° C./W. This thermal resistant value times the power loss of 25 W, as stated above, means that the power devices within the ballast housing produces heat sufficient to raise the ballast housing temperature approximately an additional 67° C. Add to this the ambient temperature of 65° C., and they will cause the semiconductor junction temperature to rise over 132° C. Even though most of the power devices have a maximum 150° C. junction temperature rating, by operating power devices substantially over 100° C. junction temperature will cause much shorter device life.

As another example, a thermal isolation barrier may be located between the HID lamp and the ballast housing to provide a thermal barrier from the heat produced by the HID lamp. However, even when the lighting fixture includes a thermal barrier, hot summer ambient temperatures and heat produced from the lighting ballast itself can raise the temperature within the ballast compartment Yet another measure to reduce junction temperature of the semiconductors includes increasing the size of the ballast housing. However, as stated above that due to space constraints within the lighting fixtures, this is not generally an acceptable means for reducing the junction temperature. Another way to increase surface area without increasing the overall size of the ballast housing is by incorporating cooling fins onto or as part of the external sides and tops of the ballast housing. An example of an extruded cooling fin wall surface is shown in FIG. 4. As an example, a standard extruded ballast housing having a height of 5 inches, width of 6 inches, and a depth of 3.5 inches, may yield up to 300 square inches equivalent surface area when cooling fins are closely spaced on the exposed surfaces. Depending on geometry and other parameters such as surface finish, extruded heat sinks can have different thermal resistances. From FIG. 3 it can be seen that 300 square inches of surface area provides in a best case scenario approximately 0.8° C./W thermal resistance. This will cause the junction temperature to rise to 110° C., a reduction of 22° C. over the aluminum cast ballast housing without cooling fins as described above. In reality, since cooling fins have to be very close to each other for obtaining 300 square inch surface area without increasing ballast size, the actual thermal resistance offered by the extruded fin surfaces will be higher. As a result, junction temperature will also be higher. In addition, incorporating cooling fins onto the ballast housing generally requires additional molding material and more expensive molds. These additional expenses increase the electronic ballast unit cost making them less price competitive with existing magnetic ballasts. In addition, extruded heat sinks are expensive and as can be seen from the above that the junction temperature still remains above 100° C.

Additionally, commercial lighting fixtures are designed such that they can only accommodate certain sized ballasts. Most of today's HID lighting is powered by magnetic ballasts that have a standard footprint and to replace them with superior electronic ballasts requires that they conform to the footprint of the existing magnetic ballast within the HID ballast housing.

Therefore, there is a need for an enclosed electronic ballast housing that provides an effective means for lowering ballast housing and semiconductor junction temperatures for keeping the junction temperature of power semiconductors inside the ballast housing within certain specified temperature ranges for long-term reliable operation, while providing the electronic ballast at a unit cost that is competitive to magnetic electronic ballasts and easy to exchange with existing magnetic ballasts.

SOLUTIONS

The above-described problems are solved and a technical advance achieved by the present enclosed electronic ballast housing that provides a method to increase the number of ballast housing radiating surfaces without increasing overall housing dimension. In another embodiment, the enclosed electronic ballast housing also distributes parts of the ballast circuitry into different sections of the ballast housing to keep semiconductor junction temperatures within certain ranges. The enclosed electronic ballast housing design overcomes the above shortcomings, by utilizing a novel folded fin design as part of a ballast housing that provides an effective means for lowering the ambient housing temperature to keep the junction temperature of the power semiconductors within certain specified temperature ranges for long-term reliable operation. The novel ballast housing design is produced by an efficient and less expensive manufacturing method to keep per unit production costs down. For example, the present enclosed electronic ballast housing may be manufactured using conventional sheet metal stamping fabrication processes, which produce the entire ballast housing at a per unit price of under $4.00. By comparison, an extruded ballast housing that offers equivalent convection surface areas may cost over $10.00.

The novel design of the ballast housing includes folded fins on at least one side of the ballast housing for providing efficient heat transfer. Additional surfaces may utilize the novel folded fin design to provide additional convection surface areas for additional heat transfer characteristics. In another embodiment, he novel electronic enclosed ballast housing further improves heat transfer characteristics by attaching some of the circuitry, typically found within ballast housings, to an additional top cover located outside and on top of ballast housing to further decrease the junction temperature found within the ballast housing. Additionally, the novel design has dimensions that are similar to existing ballast housings, used in HID and fluorescent lighting fixtures, thus allowing for easy replacement of the existing ballasts with the novel design herein disclosed.

SUMMARY

The enclosed electronic ballast housing includes a housing bottom, including a plurality of bottom side surfaces and a bottom surface to form the housing bottom; at least one folded fin spaced apart from and substantially parallel to the surface axis of at least one of the plurality of bottom side surfaces and the bottom surface, the at least one folded fin being continuous through a curved portion with the at least one of the plurality of bottom side surfaces and the bottom surface, wherein the plurality of bottom side surfaces, the bottom surface, and the at least one folded fin are made from a sheet-like material; and a housing top, including a plurality of top side surfaces and a top surface to form said housing top, wherein the plurality of top side surfaces housing top is made from a sheet-like material. Preferably, the housing top further includes an additional top cover, including a main surface connected to the housing top; at least one folded fin spaced apart from and substantially parallel to the surface axis of the main surface, the at least one folded fin being continuous through a curved portion with the main surface, wherein the main surface and the at least one folded fin are made from a sheet-like material. Preferably, the housing bottom is made from a single piece of sheet-like material. Preferably, the housing top is made from a single piece of sheet-like material.

Preferably, the housing top encloses the housing bottom to seal the ballast housing. Preferably, the enclosed electronic ballast housing further includes additional folded fins extending from the at least one folded fin. Preferably, the at least one folded fin ends in a mounting flange for securing the enclosed electronic ballast housing to a lighting fixture. Preferably, the housing bottom fits into the footprint of an existing lighting fixture ballast. Preferably, the at least one folded fin is located between the housing bottom and a lighting fixture when the enclosed electronic ballast housing is secured to the lighting fixture. Preferably, the sheet-like material has a thickness of from about 0.01 inches to about 0.30 inches. Preferably, the sheet-like material has a thickness of from about 0.01 inches to about 0.06 inches. Preferably, the sheet-like material has a thickness of 0.04 inches. Preferably, the sheet-like material is a heat conducting material selected from the group consisting metals, metal compounds, metal alloys, plastics, thermoplastics, polymers and copolymers. Preferably, the sheet-like material is selected from the group consisting of aluminum and copper. Preferably, the at least one folded fin is arranged in an accordion-style fin arrangement. Preferably, the at least one folded fin has a corrugated cross-section.

DETAILED DESCRIPTION OF THE DRAWINGS

In accordance with the present enclosed electronic ballast housing ("ballast housing"), the ballast housing may be part of many different lighting fixtures, such as fluorescent and HID lighting fixtures. Lighting fixtures as described herein include all types of lighting fixtures that require a ballast for providing power to a lamp element, including HID lamps and fluorescent lamps. In addition, the present ballast housing can be used as enclosures for other devices such as power factor corrected off line AC to DC power supplies. Particularly, the ballast housing is particularly beneficial for devices that depend on natural convection for heat removal such as high power electronic ballasts.

The term "bottom," "sides," and "top" are relative in accordance with the embodiments of the description of the present enclosed electronic ballast housing. Further, any one of the "bottom," sides," and "top" of the present enclosed electronic ballast housing may be attached to the lighting fixture. In some aspects of the present enclosed electronic ballast housing, the "bottom" may be connected or attached to the lighting fixture. In yet another aspect of the present enclosed electronic ballast housing, the "top" may be connected or attached to the lighting fixture. In yet still another aspect of the present enclosed electronic ballast housing, one or all of the "sides" may be connected or attached to the lighting fixture.

The term "folded fin" means a substantially planar extension from one of the sides, bottom, or top of the ballast housing that has been bent or curved to produce the folded fin. Preferably, the folded fin is made from the same piece of material as one of the sides, bottom, or top of the ballast housing. In another aspect, the folded fin may be a contiguous, continuous, or integral portion of the sides, bottom, or top of the ballast housing. The folded fins are a novel feature of the ballast housing as they provide excellent heat transfer conduction from the sides, bottom, or top of the ballast housing because they are made from or are part of the same material forming the sides, bottom, or top of the ballast housing. In addition, the manufacture of the ballast housing is simplified over prior art ballast housings in that the housing bottom, including the folded fin(s) are preferably made from a single piece of sheet-like material that can easily be marked, cut, and stamped for manufacturing the housing bottom. Also, housing top is preferably made from a single piece of material like the housing bottom.

Figure 1:
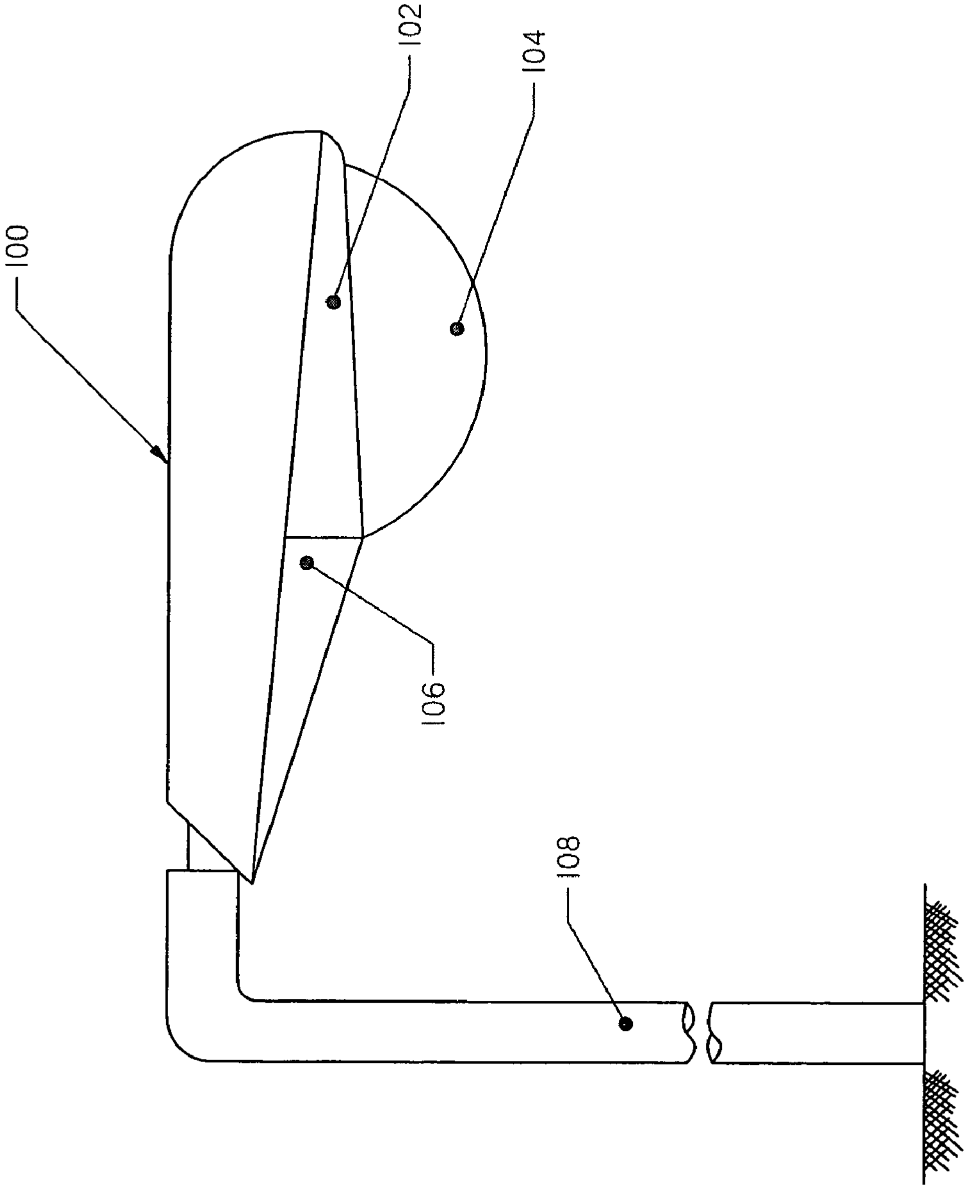
FIG. 1 illustrates a side view of a lighting fixture with an embodiment of the present enclosed electronic ballast housing of the present invention.

FIG. 1 illustrates an embodiment 100 of a lighting fixture including a lamp compartment 102 for containing the lamp (not shown) and lamp cover 104 for protecting the lamp from the elements and to provide desired light dispersion properties. Lighting fixture 100 includes ballast compartment 106 that contains the ballast housing 500 (FIG. 5) and prior art ballast housing 200 (FIG. 2), which are described below. Lighting fixture 100 is connected to a light pole 108 for support in a desired environment. Additionally, a thermal barrier may be included (not shown) that separates the lamp compartment 102 from the ballast compartment 106.

Figure 2:
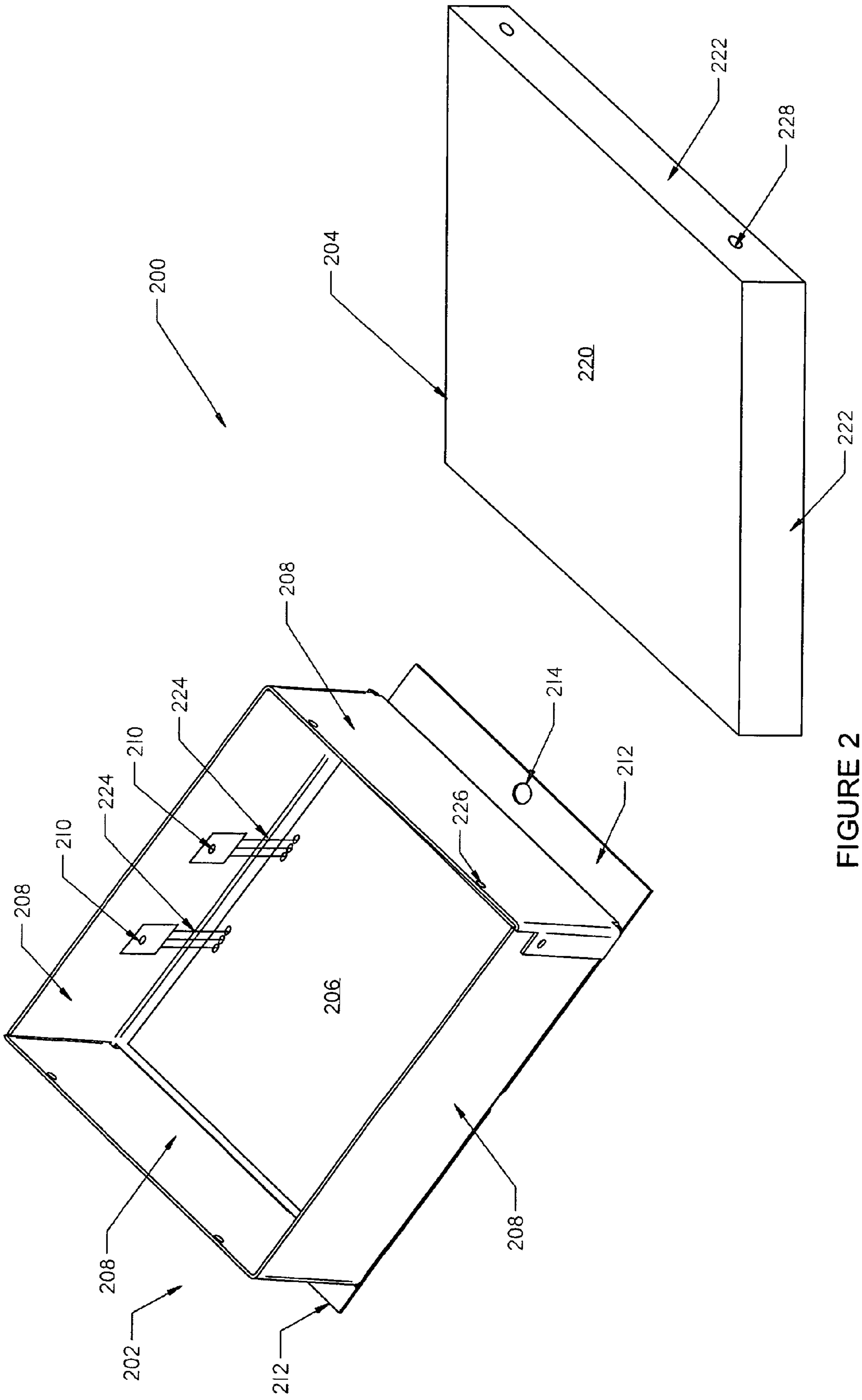
FIGURE 2 PRIOR ART
FIG. 2 illustrates a perspective view of an embodiment of a housing bottom and housing top of the enclosed electronic ballast housing of the present invention.

FIG. 2 illustrates a conventional prior art ballast housing 200. The ballast housing 200 is comprised of a housing bottom 202 and a housing top 204. The housing bottom 202 includes an interior that is defined by the four sides 208 and the bottom 508. The interior of the housing bottom 202 contains the electronics for receiving input power from an AC supply and converting it to a low frequency power to supply the lamp of the lighting fixture 100. Printed circuit board ("PCB") 206 contains ballast circuitry and electronic components and is typically attached to the inner surface of the bottom of the housing bottom 202. Dissipating power components 210, such as MOSFETS, are typically attached directly to the inside surfaces of one or more sides 208 of the housing bottom 202 and are connected to PCB 206 via wiring 224. These dissipating power components 210 are used as heat sinks for PCB 206.

The housing bottom 202 also consists of two mounting flanges, 212, for securing the housing bottom 202, through mounting holes 214, to the ballast compartment 106 of the lighting fixture 100. The housing bottom 202 typically includes fastener holes 226 for accepting fasteners, such as screws or rivets.

Housing top 204 includes a top cover 220 and four sides 222, which fit together with the four sides 208 of the housing bottom 202 to produce and enclose the prior art ballast housing 200. The housing top 204 typically include fastener holes 228 around the perimeter of the sides 222 that mate with fastener holes 226 of the housing bottom to accept fasteners, such as screws or rivets, for securing the housing bottom 202 to the housing top 204. Additional attaching means, such as welds, brazes, adhesives, and the like may be used to attach the housing bottom 202 to the housing top 204.

Figure 3:
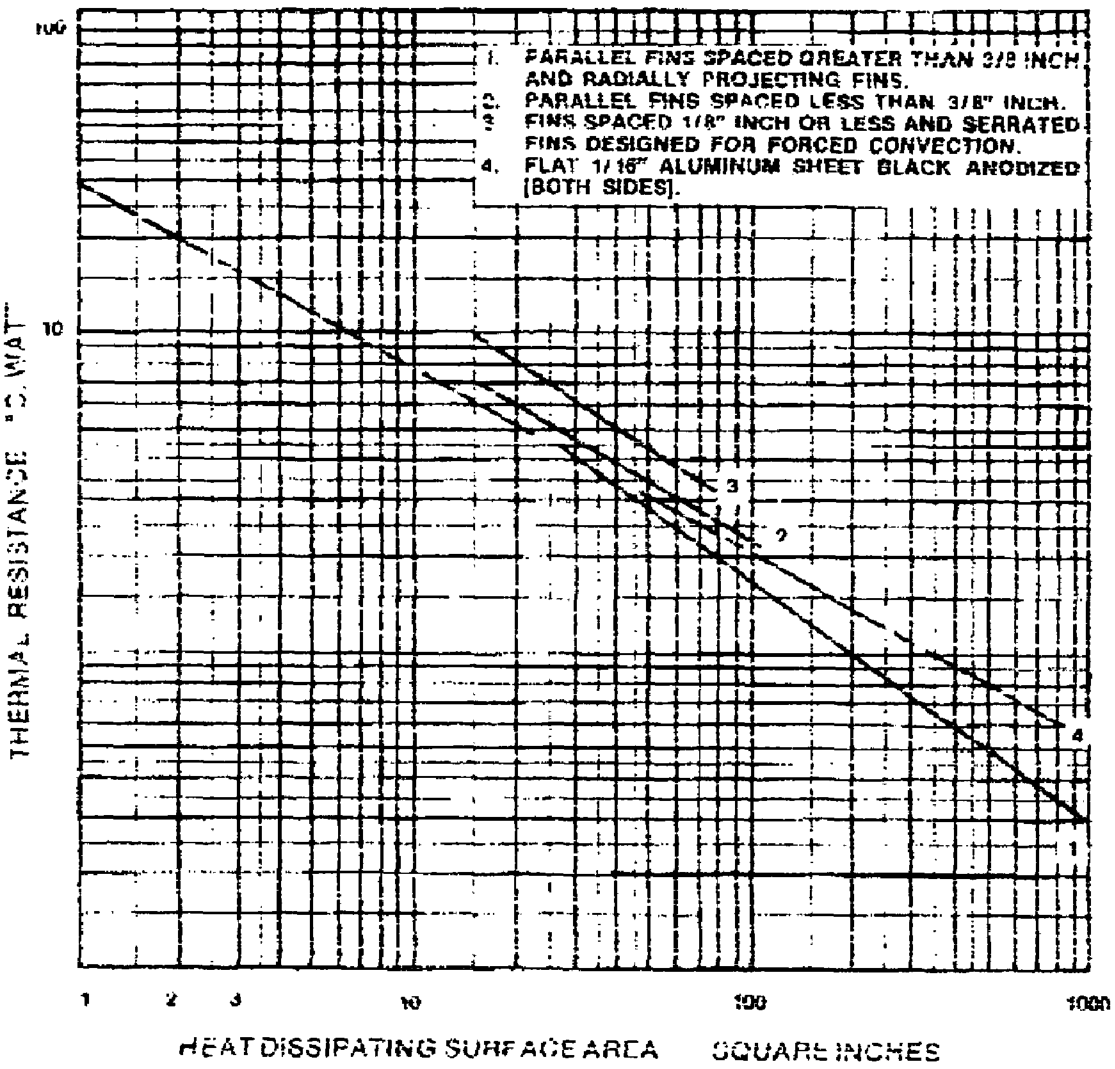
FIG. 3 illustrates a thermal resistance versus surface area chart for black aluminum surfaces.

FIG. 3 is a chart showing the thermal resistance versus surface area for black aluminum surfaces from the reference book titled, "Heat sink applications hand book" by Jack Spoor (copyright by AHAM INC. of Rancho Calif., USA).

This chart provides some of the data for the calculations disclosed herein. It is noted that thermal resistance is not a linear function of surface area. It can be seen, that by doubling the surface area one can reduce thermal resistance not by half, but rather only by one third or so.

Figure 4:
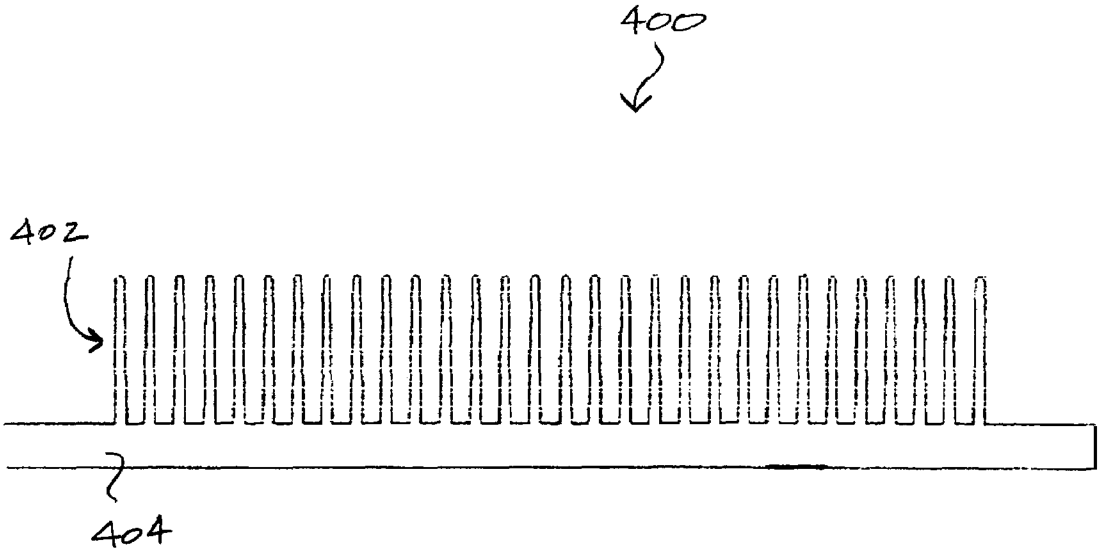
FIG. 4 illustrates a prior art arrangement of cooling fins located on top of a typical housing top of a ballast housing.

FIG. 4 illustrates an embodiment 400 of a surface 404 having cooling fins 402 as commonly found in the art. Generally, this type of cooling fins 402 are extruded separately and then attached to the surface 404. In addition, it can be seen that a significant amount of material must be used to create such a cooling fin 402 and then attach the cooling fin 402 to the surface 404. This process involves greater expenses from extra material to extra processing steps and machines required produce these heat transfer surfaces. Conversely, the present ballast housing 500 includes folded fins that are manufactured from the same piece of sheet-like material, thus eliminating much of the expense associated with expensive extrusion methods.

Figure 5:
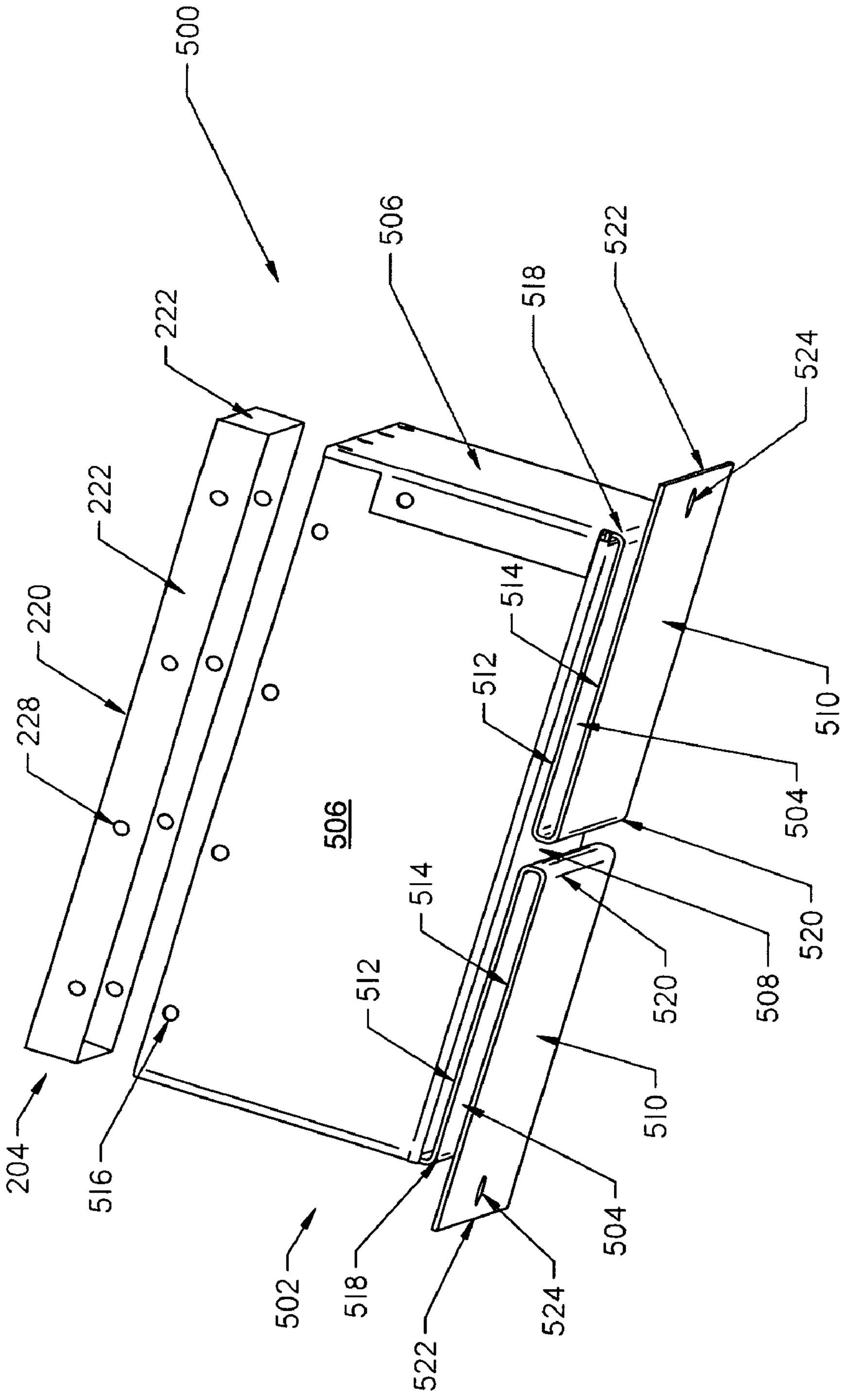
FIG. 5 illustrates a perspective view of the housing bottom of FIG. 2 of the present invention.

FIG. 5 illustrates an embodiment of the present ballast housing 500. In this embodiment, the ballast housing 500 is comprised of a housing bottom 502 and the housing top 204. The housing bottom 502 includes an interior (not shown), similar to that described to housing bottom 202 that is defined by the four sides 506 and the bottom 508. Those electronic components described and their locations relative to housing bottom 202 are found similarly in housing bottom 502. Thus, the housing bottom 502 contains the electronics for receiving input power from an AC supply and converting it to a low frequency power to supply the lamp of the lighting fixture 100. Printed circuit board ("PCB") 206 (not shown) contains ballast circuitry and electronic components and is typically attached to the inner surface of the bottom 508 of the housing bottom 502. Dissipating power components 210, such as MOSFETS (not shown), are typically attached directly to the inside surfaces of one or more sides 506 of the housing bottom 502 and are connected to PCB 206 via wiring 224 (not shown). These dissipating power components 210 are used as heat sinks for PCB 206.

FIG. 5 further illustrates the outer surface of the bottom 508 of the housing bottom 502 showing the sides 506 and mounting flanges 522 as described above. The mounting flanges 522 secure the housing bottom 502, through mounting holes 524, to the ballast compartment 106 of the lighting fixture 100. The housing bottom 502 typically includes fastener holes 516 for accepting fasteners, such as screws or rivets. In one embodiment and as described further in FIG. 6, the material for the housing bottom 502 and sides 506 are preferably cut, stamped, and fabricated from one piece of material. In this process, the housing bottom 502 has excess material, over that required for the sides 506 and bottom 508, that is folded or curved at curved portion 518 to create folded fin 504 and spacings 512 between folded fin 504 and bottom 508. The material is then folded or curved again, at curved portion 520 to create folded fin 510 and spacings 514 between folded fins 504 and 510. Because the housing bottom 502 is preferably made out of one piece of material, the mounting flanges 522 and folded fins 504 and 510, which are integral part of respective sides 506, can be extended and bent, inward and then outward, to increase the surface area of the bottom 508. Since, both the housing bottom 502 and the ballast compartment 106 are made out of metals, alloys, or compositions a good thermal contact between the mounting flanges 522 and the ballast compartment 106 is preferable to increase heat rate transfer to thereby further reduce ballast housing temperature. In one aspect, good thermal contacts can be obtained by use of large metal washers and conductive thermal pads or paste, for example.

The housing top 204 typically include fastener holes 228 around the perimeter of the sides 222 that mate with fastener holes 516 of the housing bottom 502 to accept fasteners, such as screws or rivets, for securing the housing bottom 502 to the housing top 204. Additional attaching means, such as welds, brazes, mounting slots, adhesives, and the like may be used to attach the housing bottom 502 to the housing top 204.

The folded fins 504 and 510 are substantially planar and preferably do not increase the outer dimensions of the footprint of the housing bottom 502, aside from the mounting flanges 522. As can be seen from FIG. 5, the folded fins 504 and 510 are substantially parallel to the bottom 508 and fit within the existing footprint or area of the bottom 508. Additional folded fins may also be used. In one embodiment, the folded fins could be fabricated such that they are longer than those shown in FIG. 5, to provide additional folded fins over that shown in FIG. 5.

As described above, the folded fins 504 and 510 are substantially planar and can be designed and manufactured in varying widths. As described in FIG. 6 below, preferably, the housing bottom 502 is made from a single sheet of material, thus the widths of the folded fins 504 and 510 can be varied according to the desired application of the housing bottom. Further, since the folded fins 504 and 510 preferably do not exceed the footprint of bottom 508 so that existing ballasts can be replaced with the ballast housing 500 without having to modify the ballast compartment. The spacings 512 and 514 have heights that are suitable for each application. For example, in one embodiment, the spacings are 0.25 inches in height. Of course the overall height of the ballast housing 500 is determinable in part by the heights of the spacings 512 and 514 and the thicknesses of the folded fins 504 and 510.

It is also noted that folded fins 504 and 510 are shown on both sides of housing bottom 502. In another embodiment, folded fins could each extend across the width of the housing bottom 502. In another aspect, the ballast housing 500 may include more or less folded fins to provide the desired amount of heat transfer. Additional arrangements of folded fins 504 and 510 could be used without departing from the spirit of the present ballast housing 500. For example, one folded fin 504 could be used in certain applications, while additional folded fins could be used in others.

Figure 6:
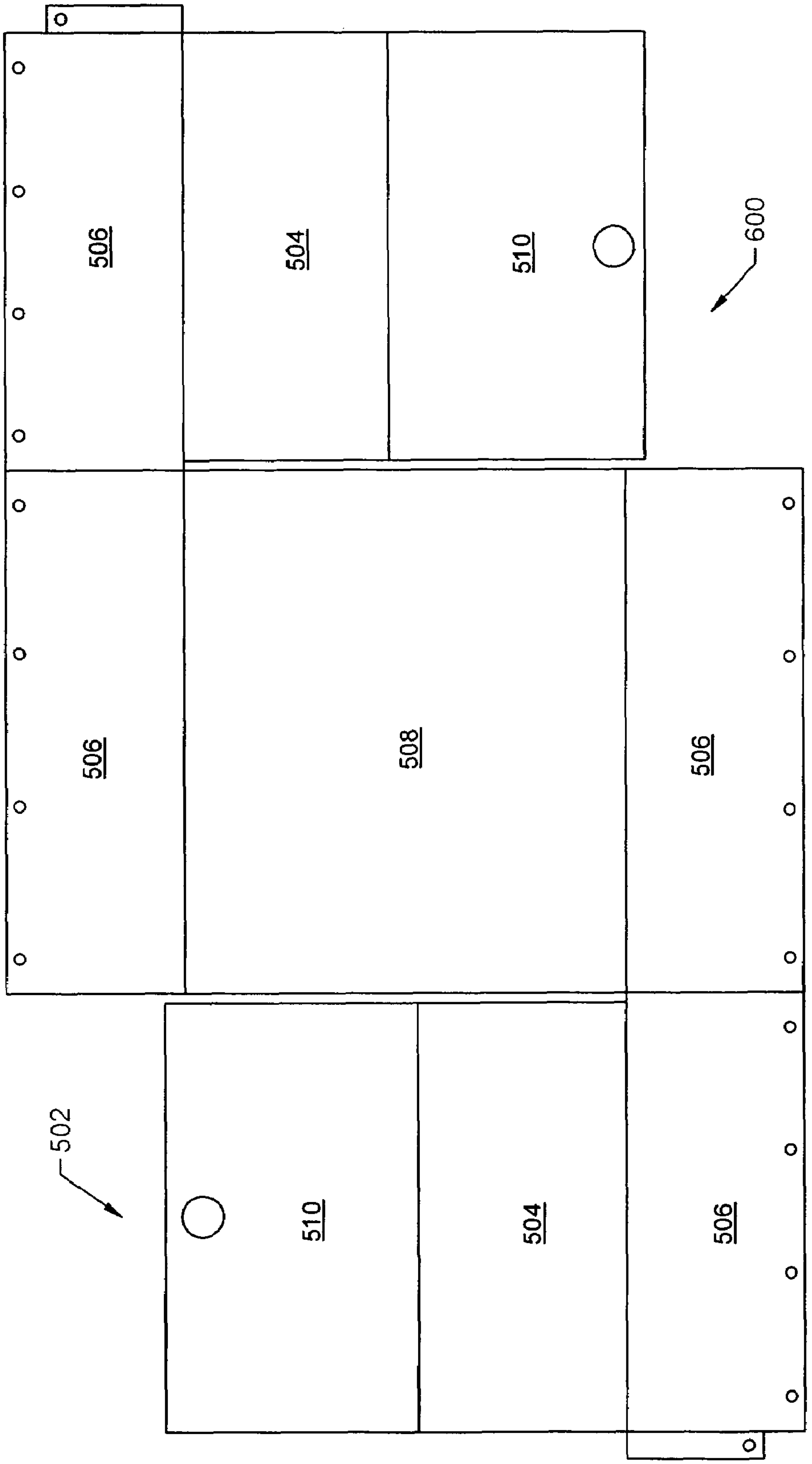
FIG. 6 illustrates a plan view of the material stamping layout of the housing bottom of FIG. 2 of the present invention.

FIG. 6 illustrates an embodiment 600 of the entire housing bottom 502 that is preferably made from a single metal sheet. This is very beneficial for many reasons. For example, if ballast bottom flanges are built separately then, by attaching mounting flanges to the bottom half by screws and even by spot welding will add thermal resistance between flanges and the remainder of the bottom half. Therefore, for uniform and better convection, this type of ballast bottom should be made using sheet metal stamping or by die cast fabrication processes, for example.

Figure 7:
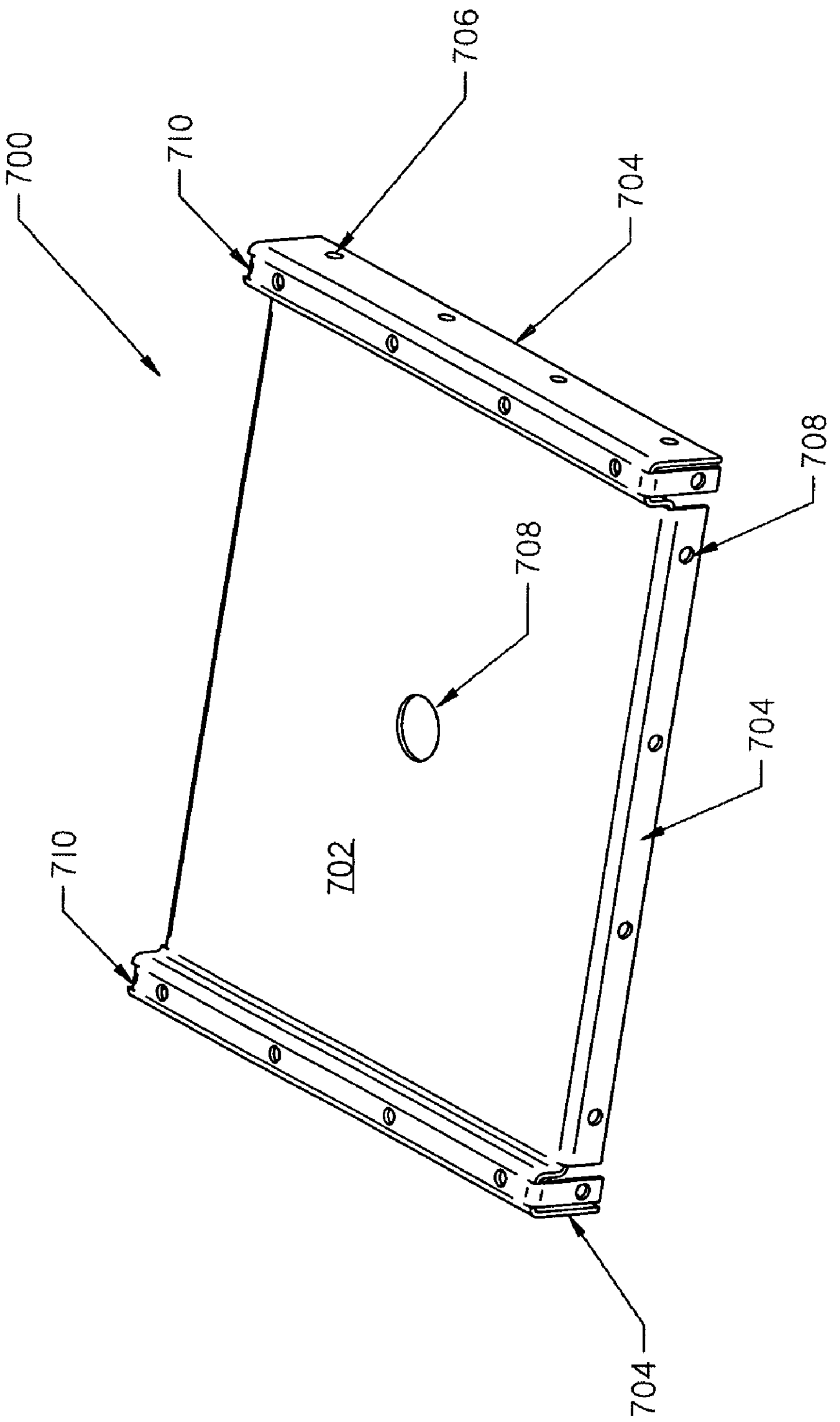
FIG. 7 illustrates a perspective view of another embodiment of a housing top of the enclosed electronic ballast housing of the present invention.

In addition to the housing bottom having folded fins 504 and 510 for efficient heat transfer of the ballast housing 500, the housing top 502 may also include additional heat transfer features for providing additional cooling functions for the ballast housing 500. FIG. 7 illustrates an embodiment 700 of a housing top. Housing top 700 includes top cover 702, sides 704, and inverted U-shaped ends 710. The housing top 700 includes an access hole 708 for routing wiring from PCB 1704 (FIG. 17) as described further below. The housing top 700 preferably includes fastener holes 706 around the perimeter of the sides 704 that mate with fastener holes 516 of the housing bottom 502 to accept fasteners, such as screws or rivets, for securing the housing bottom 502 to the housing top 700.

Figure 8:
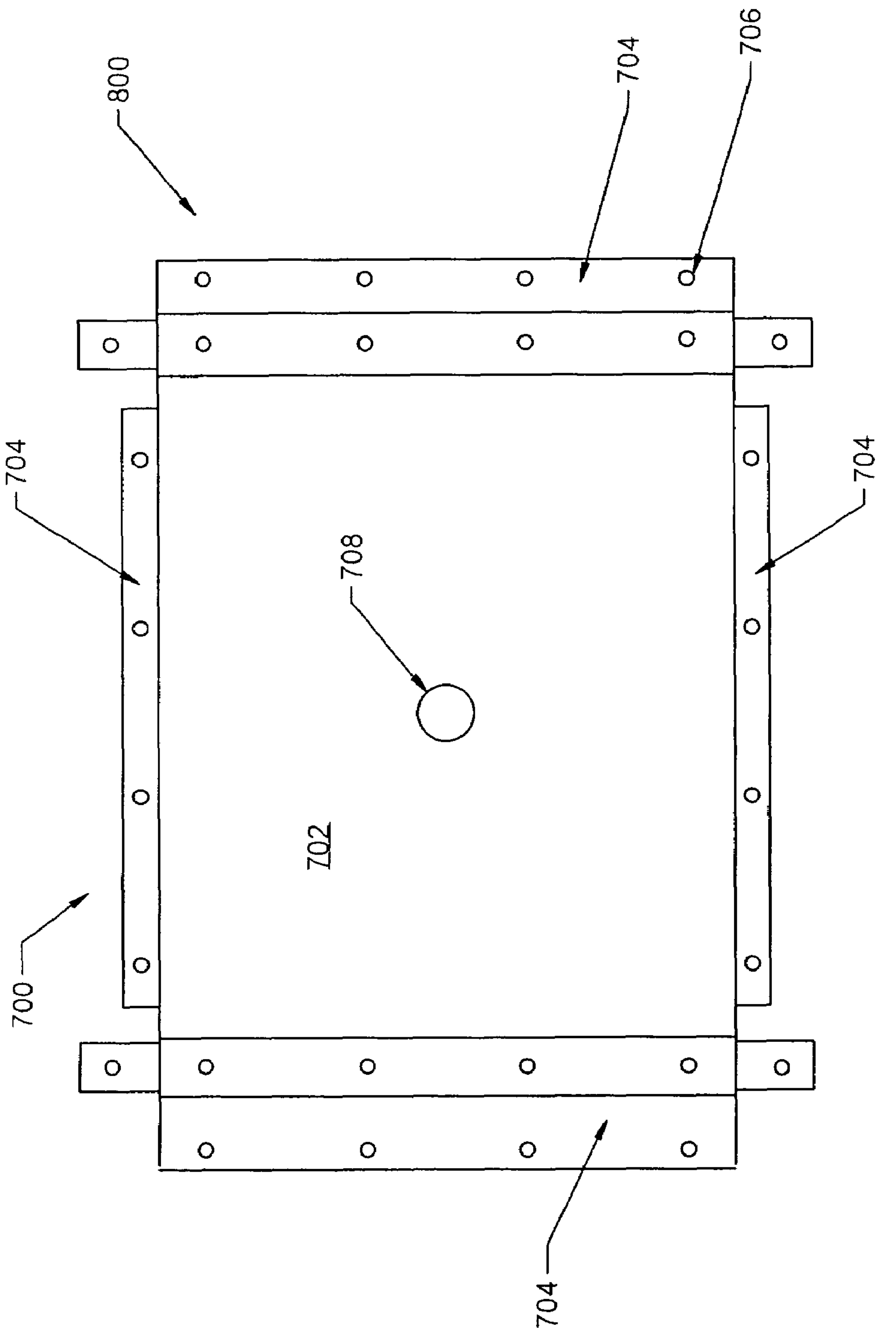
FIG. 8 illustrates a plan view of the material stamping layout of the housing top of FIG. 7 of the present invention.

FIG. 8 illustrates an embodiment 800 of the entire housing top 700 is preferably made from a single metal sheet. Therefore, for uniform and better convection, housing top 700 should be made using sheet metal stamping or by die cast fabrication processes, for example.

Figure 9:
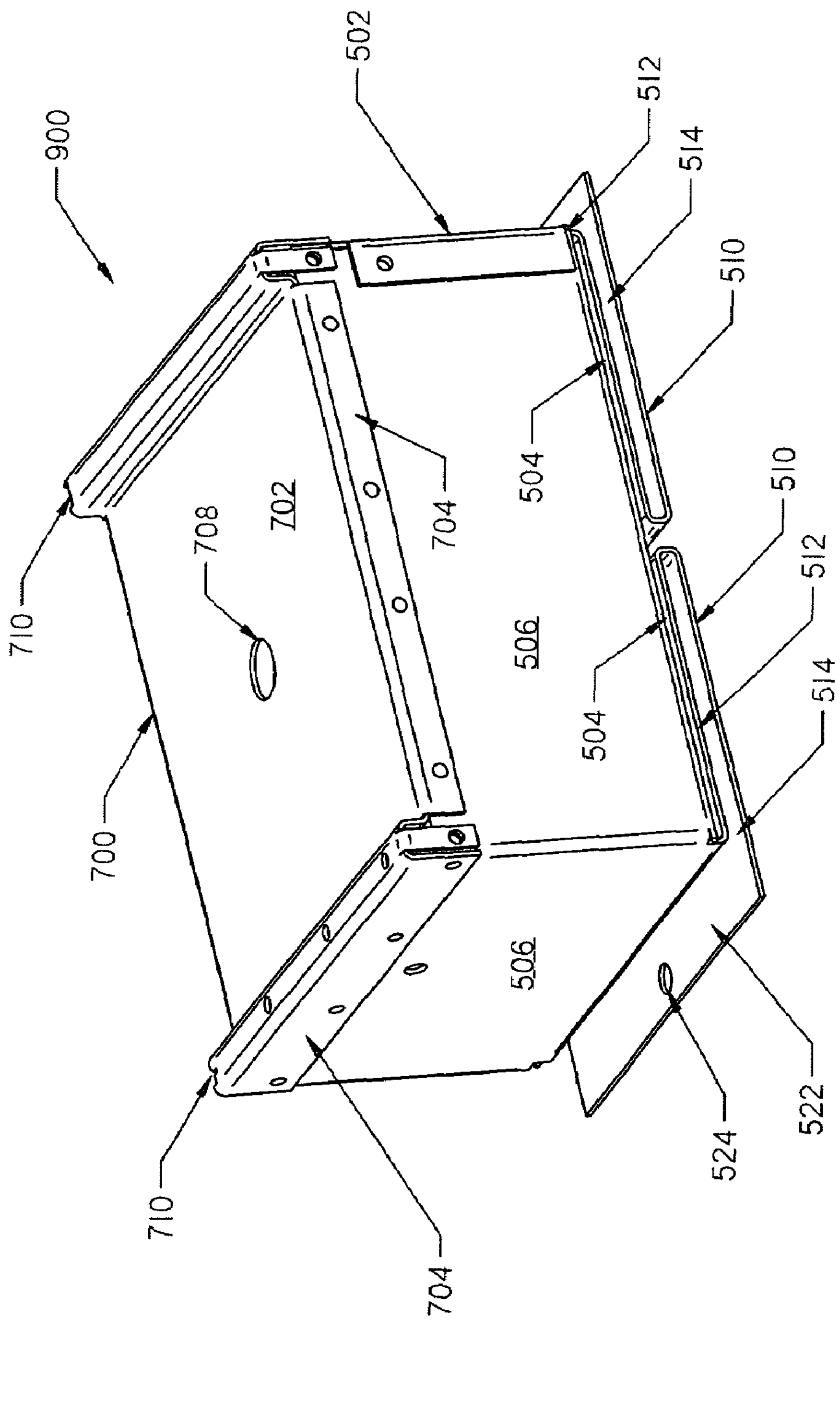
FIG. 9 illustrates a perspective view of another embodiment of the enclosed electronic ballast housing of the present invention.

FIG. 9 illustrates embodiment 900 of the ballast housing including housing top 700 attached to housing bottom 502. It can be seen from FIG. 9 that the ends 710 of housing top 700 are extended upward and preferably have an inverted U-shape whose tops are flat. In one aspect, the height of these ends are approximately 0.35 inches high.

Figure 10:
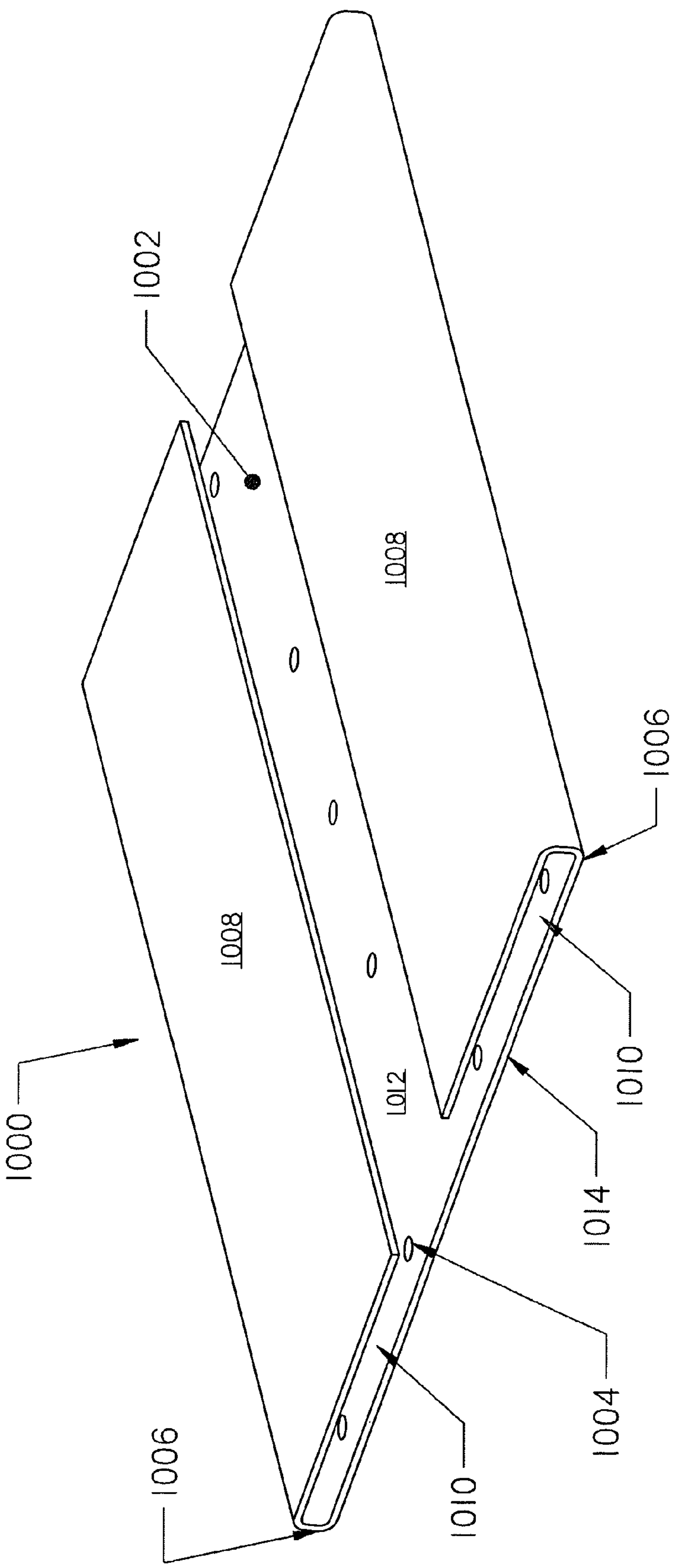
FIG. 10 illustrates a perspective view of an additional top cover of the enclosed electronic ballast housing of the present invention.
Figure 13:
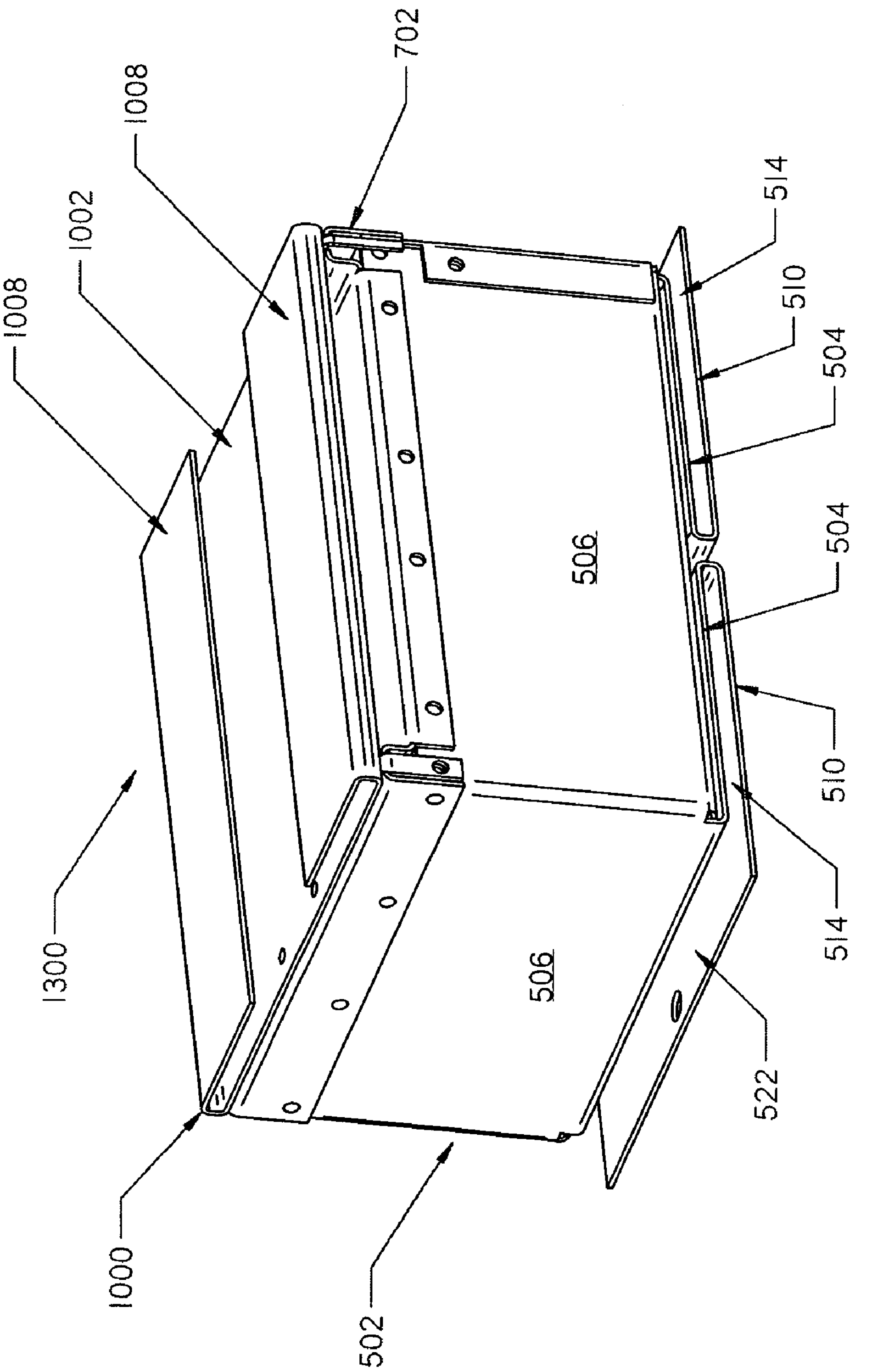
FIG. 13 illustrates a perspective view of an embodiment of the enclosed electronic ballast housing including additional top cover of FIG. 10 attached to the top cover of FIG. 7.

FIG. 10 illustrates an embodiment 1000 of an additional top cover. Top cover 1000 includes a main surface 1002 having a top surface 1012 and a bottom surface 1014. Top cover 1000 further includes folded fin 1008 that can be formed by folding, at curved portion 1006, the material comprising the additional top cover 1000 to form spacing 1010 between the folded fin 1008 and the main surface 1002. The additional top cover 1000 preferably include fastener holes 1004 around the perimeter of the main surface 1002 that mate with fastener holes 706 of the inverted U-shaped ends 710 of the top cover 702 to accept fasteners, such as screws or rivets, for securing the top cover 702 to the additional top cover 1000 as shown in FIG. 13. In one embodiment, the overall height of the additional top cover 1000 is approximately 0.2 inches. In this embodiment, when the additional top cover 1000 is attached to the top cover 702, the overall height of the housing ballast 1300 is less than 3 inches. In one embodiment, the spacing between the ends of folded fins 1008 is approximately 1 inch.

In one embodiment, the additional top cover 1000 has an overall surface area of approximately 108 square inches. Referring to FIG. 3, this surface area offers a thermal resistance of approximately 2° C./W. Thus, for 8 W dissipation and at 65° C. ambient, the junction temperature of rectifying diodes may reach approximately ((2+1)° C./W×8 W+65° C.))=89° C.

Figure 11:
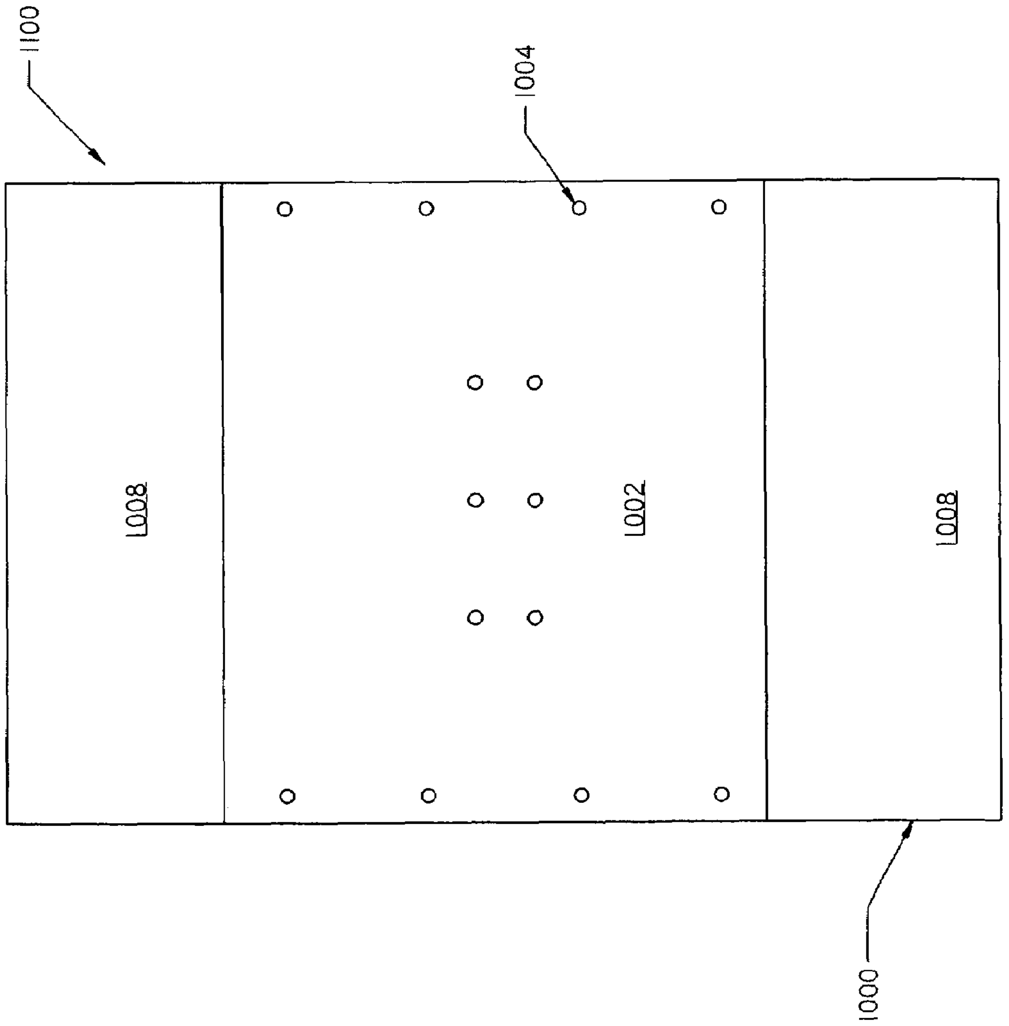
FIG. 11 illustrates a plan view of the material stamping layout of the additional top cover of FIG. 10 of the present invention.

FIG. 11 illustrates an embodiment 1100 of the additional top cover 1000 that is preferably made from a single metal sheet. For uniform and better convection, this type of additional top cover 1000 should be made using sheet metal stamping or by die cast fabrication processes, for example.

Figure 12:
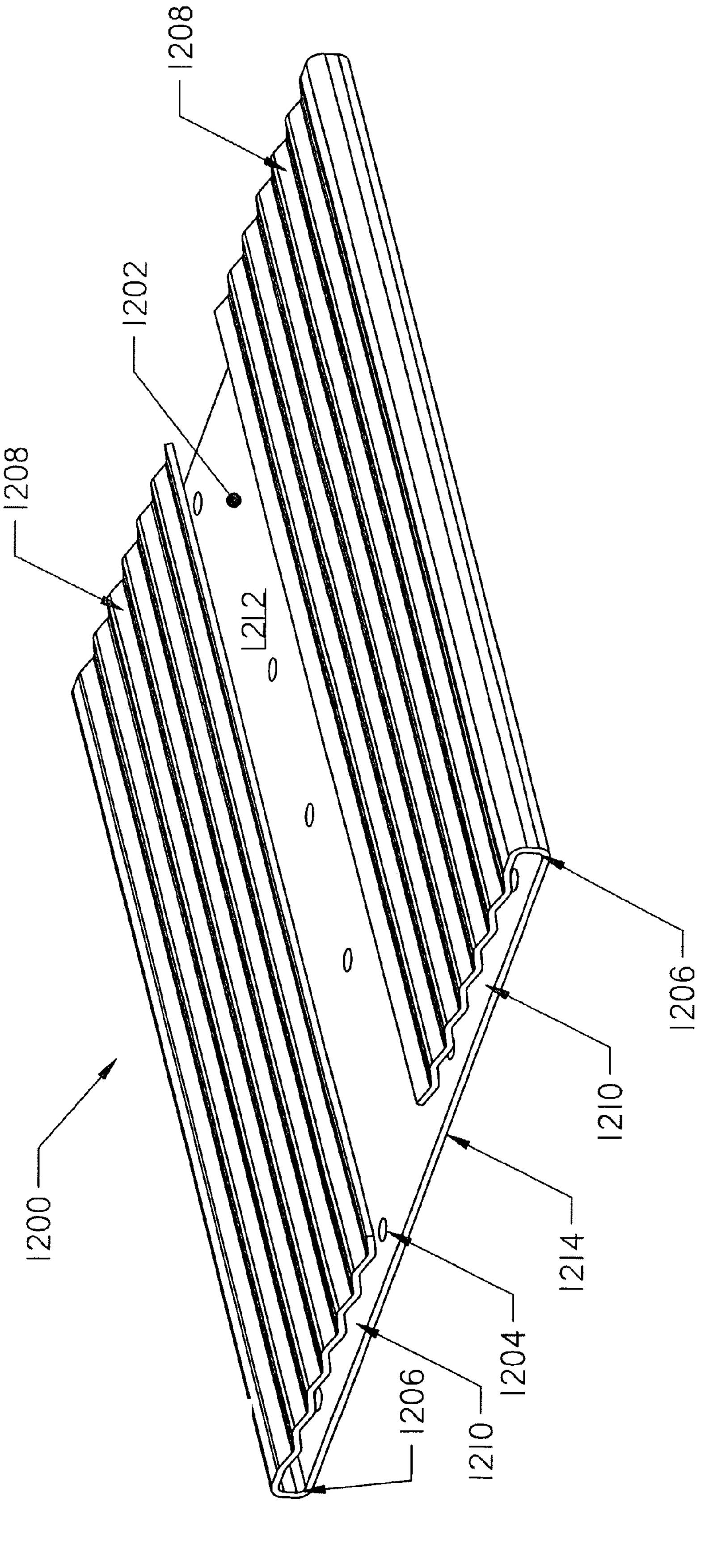
FIG. 12 illustrates a perspective view of another embodiment of an additional top cover including corrugated folded fins of the enclosed electronic ballast housing of the present invention.

FIG. 12 illustrates another embodiment 1200 of an additional top cover. Additional top cover 1200 includes a flat section 1202 having a main surface 1212 and a bottom surface 1214. Top cover 1200 further includes folded fin 1208 that can be formed by folding, at curved portion 1206, the material comprising the additional top cover 1200 to form spacing 1210 between the folded fins 1208 and the flat section 1202. The additional top cover 1200 preferably include fastener holes 1204 around the perimeter of the flat section 1202 that mate with fastener holes 706 of the top cover 702 to accept fasteners, such as screws or rivets, for securing the top cover 702 to the additional top cover 1200. For providing additional heat transfer capabilities, the folded fins 1208 of the additional top cover 1200 are corrugated to increase the surface area of the folded fins 1208. Additionally, folded fins 504, 510, 1008, 1208, 1410, and 1412 may also have a corrugated cross-section to increase the surface area of these folded fins. Preferably, additional top cover 1200 is made from a single metal sheet. For uniform and better convection, the additional top cover 1200 should be made using sheet metal stamping or by die cast fabrication processes, for example.

FIG. 13 illustrates an embodiment 1300 of the ballast housing depicting the housing bottom 202, top cover 702, and additional top cover 1000. In another embodiment, additional top cover 1200 may be used in place of additional top cover 1000. Ballast housing 1300 shows the additional top cover 1000 located on top of the top cover 702 for increased surface area and improved heat transfer. In another embodiment, additional top covers may be added on top of additional top cover 1000.

Figure 14:
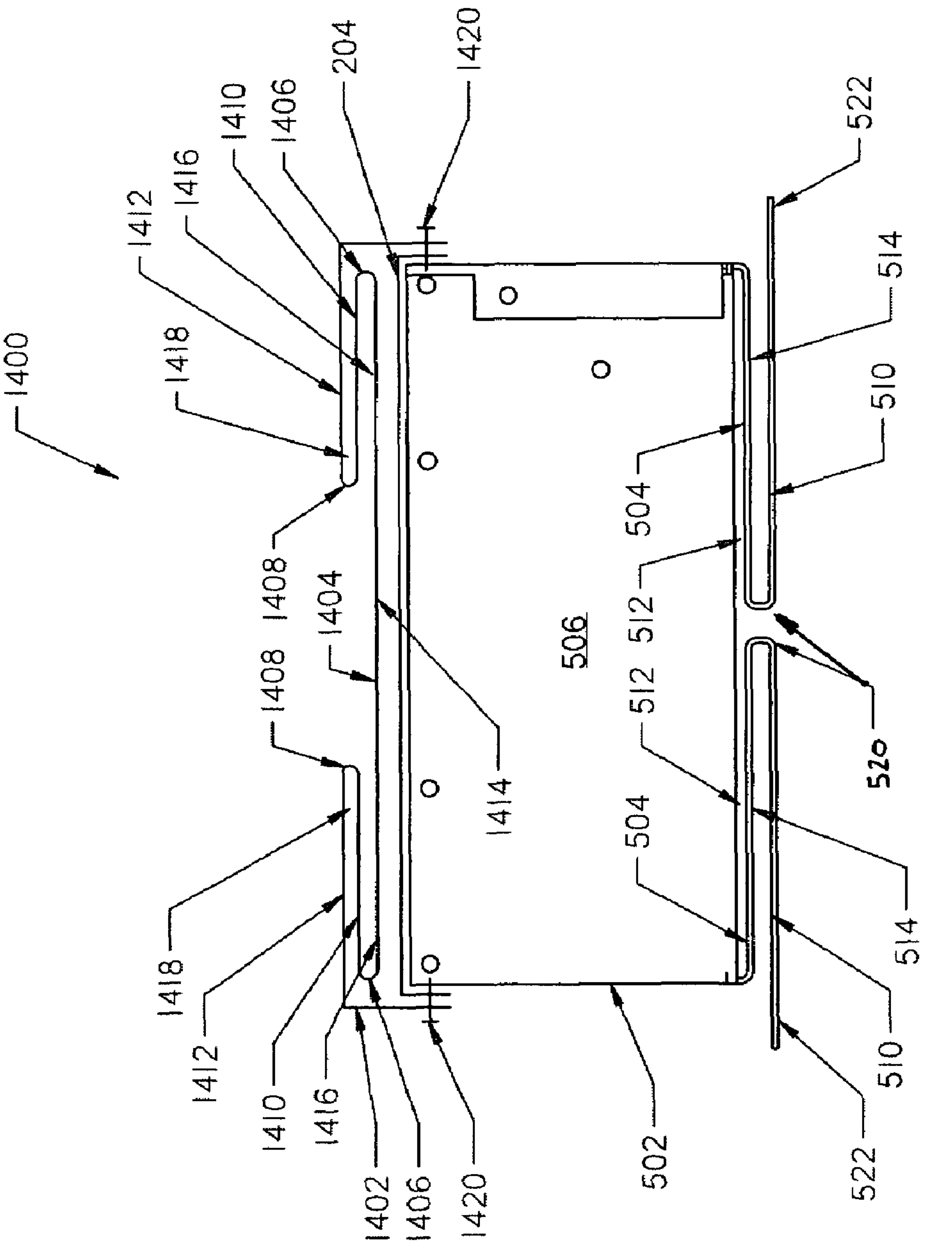
FIG. 14 illustrates a cross-sectional view of the enclosed electronic ballast housing of FIG. 13 of the present invention.
Figure 15:
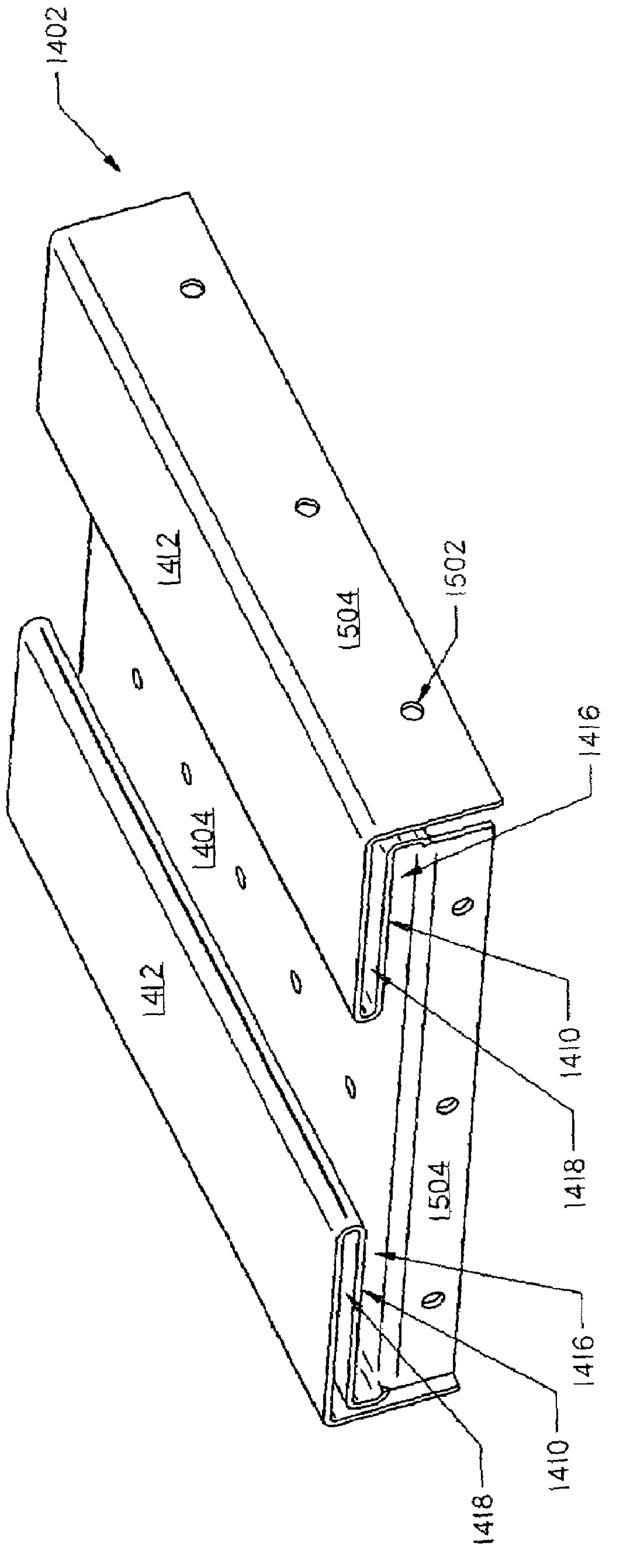
FIG. 15 illustrates a perspective view of another embodiment of an additional top cover of the enclosed electronic ballast housing of the present invention.

FIG. 14 illustrates another embodiment 1400 of the ballast housing including another embodiment of additional top cover 1402 on top of housing top 204. Additional top cover 1402 includes a flat section 1404 and folded fins 1410 and 1412 that can be formed by folding, at curved portions 1406 and 1408, the material comprising the additional top cover 1402 to form spacings 1414, 1416, and 1418 between the folded fins 1410 and 1412 and the flat section 1404. The additional top cover 1402 preferably include fastener holes 1502 (FIG. 15) around the perimeter of the flat section 1404 that mate with fastener holes 228 of the housing top 204 to accept fasteners 1420, such as screws or rivets, for securing the housing cover 204 to the additional top cover 1402 as shown in FIG. 14. FIG. 15 illustrates additional top cover 1402 including sides 1504 that connect with housing top 204.

Figure 16:
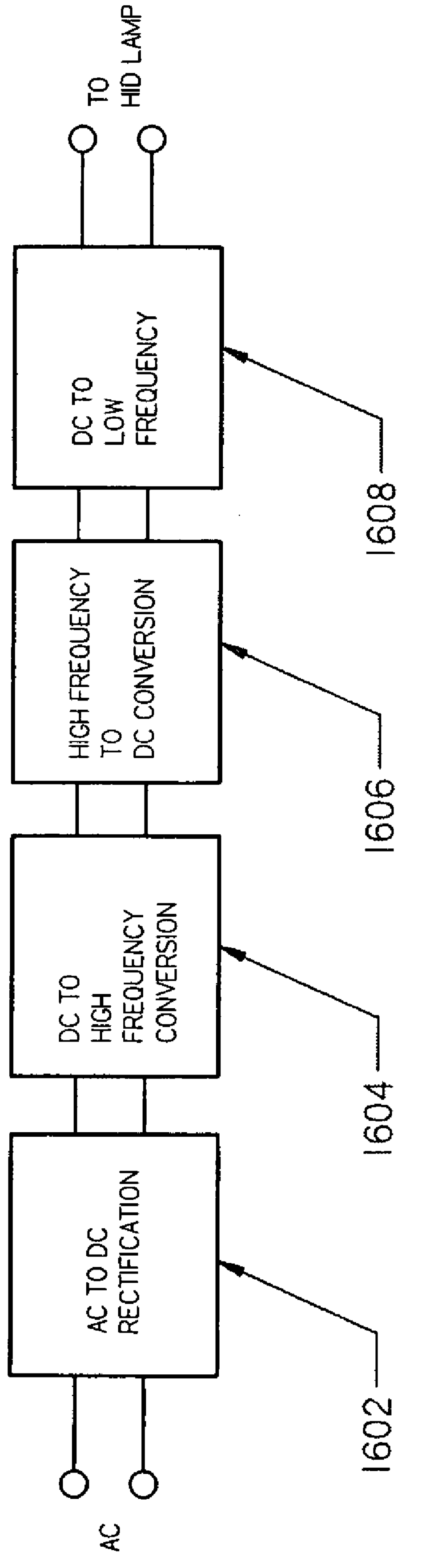
FIG. 16 illustrates a block diagram depicting the ballast circuitry of the enclosed electronic ballast housing of the present invention.
Figure 17:
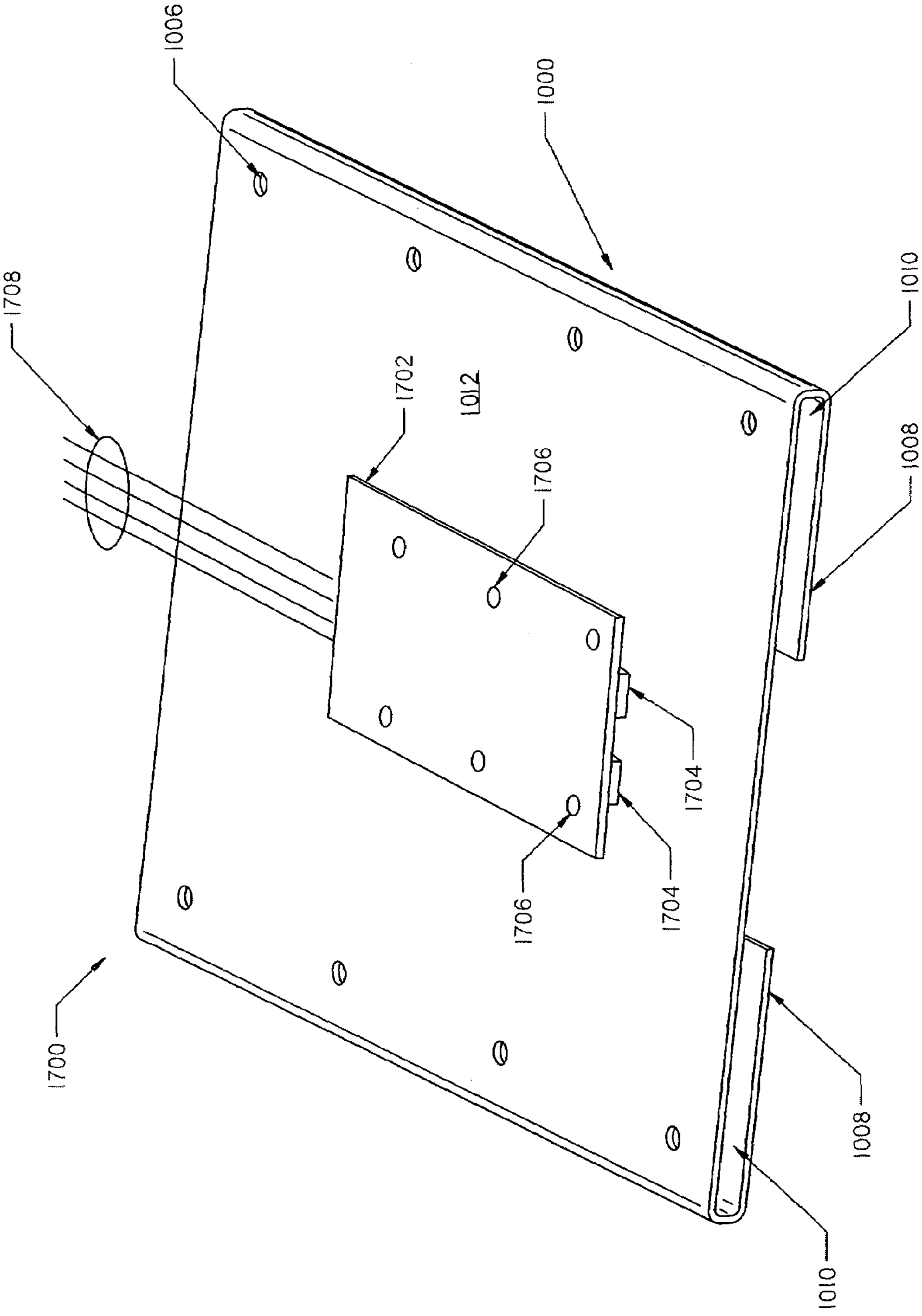
FIG. 17 illustrates a perspective view of another embodiment of an additional top cover including attached rectifying diodes to its bottom surface of the present invention.

FIG. 16 illustrates a block diagram depicting the four major primary sources of heat dissipation in ballast housings. These sources include: first, AC to DC rectification 1602; second, DC to high frequency conversion 1604; third, high frequency to DC conversion 1606; and finally, DC to low frequency lamp operation 1608. To further improve heat transfer within the ballast housing, preferably one or more heat dissipating sections within the ballast circuitry that can be separated out without compromising the ballast design. In one embodiment, experience has shown that approximately 8 W are lost in a 250 W HPS electronic ballast high frequency to DC conversion 1606. FIG. 17 shows one embodiment depicting the isolation of one such heat source.

In addition, in order to meet regulatory requirements, most of the electronic ballasts also utilize a power factor correction circuitry for obtaining high power factor and low harmonic distortions. This is an additional section and can dissipate in excess of 10 W in a 250 W HPS ballast. Like the high frequency to DC conversion section as described above, this power factor correction section can also be separated out and attached to additional top cover 1000, as described below, without compromising the ballast design and performance.

FIG. 17 illustrates an embodiment 1700 of additional top cover 1000 including a PCB 1702 including rectifying diodes 1704 that are responsible for converting high frequency to DC. In this embodiment, the PCB 1702 including rectifying diodes 1704 within the ballast circuitry can be separated out without compromising the ballast design. PCB 1702 primarily consists of rectifying diodes 1704 that can be separated from the PCB 206 as a block without adding complexity and hampering ballast circuit design. These rectifying diodes 1704 now can be assembled on a separate PCB 1702 and can be attached on the bottom surface 1014 of the additional top cover 1000. Accordingly, additional top cover 1000 now becomes the heat-sinking element for these rectifying diodes 1704. The spacing between the two folded fins 1008 allows fasteners to fasten the PCB 1702 to the bottom surface 1012, through fastener holes 1706, to cause the rectifying diodes 1704 to come in tight contact with the bottom surface 1012 of the additional top cover 1000 for good heat transfer. PCB 1702 is attached, via fastener holes 1706, to the bottom surface 1016 of the additional top cover 1000.

Figure 18:
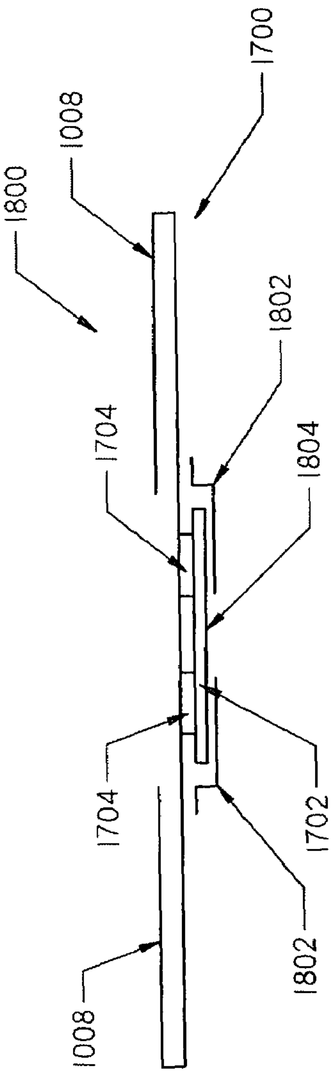
FIG. 18 illustrates a cross-sectional view of the additional top cover with attached rectifying diodes of FIG. 17 including a metal cover of the present invention.
Figure 19:
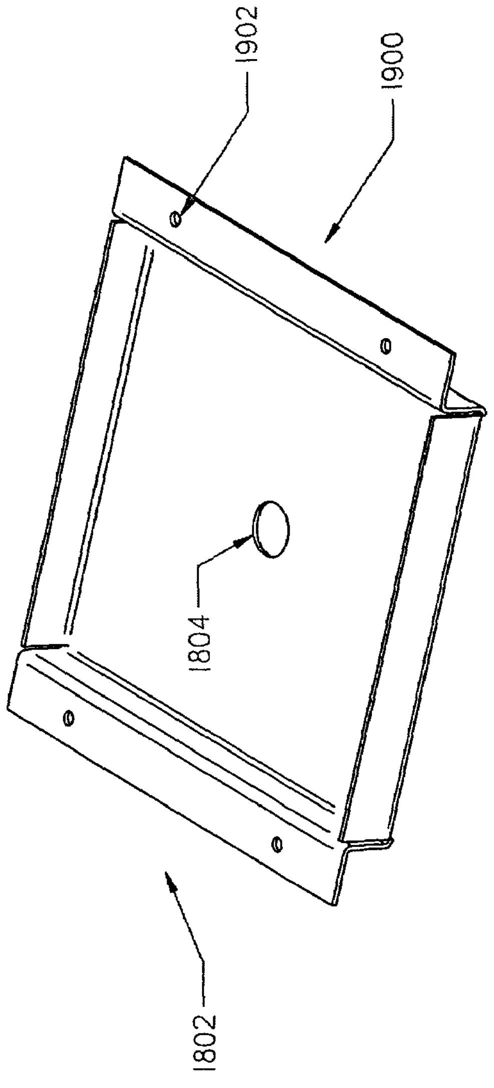
FIG. 19 illustrates a perspective view of the metal cover of FIG. 18 of the present invention.

FIG. 18 illustrates an embodiment 1800 of the additional top cover 1700 including PCB 1702 and rectifying diodes 1704. Typically, the entire ballast housing is required to be connected to earth ground, thus in order to avoid any electromagnetic interference, a metal cover 1802 (FIG. 18) may be inserted for shielding over the PCB 1702 and rectifying diodes 1704. The PCB 1702 and rectifying diodes 1704 are connected to the PCB 206, via wiring assembly 1708. The wiring assembly 1708 is routed through access hole 1804 (FIGS. 18 and 19) of metal cover 1802 and then through access hole 708 of housing top 700 for connection to PCB 206. FIG. 19 illustrates an embodiment 1900 of the metal cover 1802 including fastener holes 1902 for use with fasteners, such as screws or rivets, for connecting it to the additional top cover 1700.

The material for the present ballast housing preferably includes materials with desirable heat transfer rates, such as aluminum and copper. Preferably, the ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800 are made from aluminum and can be cast aluminum, die cast, or machined from aluminum. It is to be understood, however, that any of these components could be made from any suitable material with the appropriate structural characteristics. The material is preferably made into sheets for the fabrication of the ballast housing. The thickness of this material is preferably between 0.01 inches and 0.50 inches, and more preferably 0.020 to about 0.060 inches. It is also known that the thickness of the 504, 510, 1008, 1208, 1410, and 1412 may also be between 20 millimeters and 100 millimeters. An exemplary material is 0.040 inch standard black anodized aluminum.

The dimensions of the ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800 can be any size to fit within a footprint or space of lighting fixtures. In one embodiment, they are sized to fit the existing footprint of lighting fixture ballast.

Folded fins 504, 510, 1008, 1208, 1410, and 1412 can be any dimensions required to fit a particular application. In one embodiment, the folded fins 504, 510, 1008, 1208, 1410, and 1412 are preferably between 1 inches and 6 inches in length and 1 inch to 5 inches in width. The thickness of the 504, 510, 1008, 1208, 1410, and 1412 are preferably between 0.01 inches and 0.50 inches, and more preferably 0.020 to about 0.060 inches. It is also known that the thickness of the 504, 510, 1008, 1208, 1410, and 1412 may also be between 20 millimeters and 100 millimeters. An exemplary material is 0.040 inch standard black anodized aluminum. Additionally, inserting small spacers between the folded fins 504, 510, 1008, 1208, 1410, and 1412 can maintain the spacing between them and the adjacent supporting structure or ballast housing component.

Additionally, additional top covers 1000, 1200, 1402 can be made such that they can have only one folded fin. Further, each folded fin 504, 510, 1008, 1208, 1410, and 1412 can have multiple spaced folded layers. In addition, both top cover 702 and additional top covers 1000, 1200, 1402 may also be constructed with additional folded fins for further increasing surface areas. In another embodiment, the ends of additional top covers 1000, 1200, 1402 may include additional inverted U-shaped mountings for attaching an additional top cover 1000, 1200, 1402. Further, rather than inverted U-shape, a separate rectangular metal bar with slots and screw holes may be used to attach top cover 702 and additional top covers 1000, 1200, 1402. In another embodiment, folded fins 504, 510, 1008, 1208, 1410, and 1412 may be manufactured on the side of the housing bottom 502 or any other surfaces associated with the ballast housings 500, 900, 1300, 1400. Further, part or a portion of the ballast housings 500, 900, 1300, 1400 may have extrusions to further increase its surface area. These variations and other variations will be obvious to those skilled in the art.

The ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800 are shown generally for a rectangular box shape, however, in another aspect of the present ballast housing the shape of the ballast housing can be any desired shape.

In addition to the aforementioned aspects and embodiments of the present ballast housing, the present invention further includes methods for manufacturing these ballast housings. In one embodiment, fabrication of ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800 is done by laying out a pattern on a sheet of material and then cutting this material out and then stamping the material into the shapes shown in the figures. These layouts are shown in FIGS. 6, 8, and 11.

Figure 20:
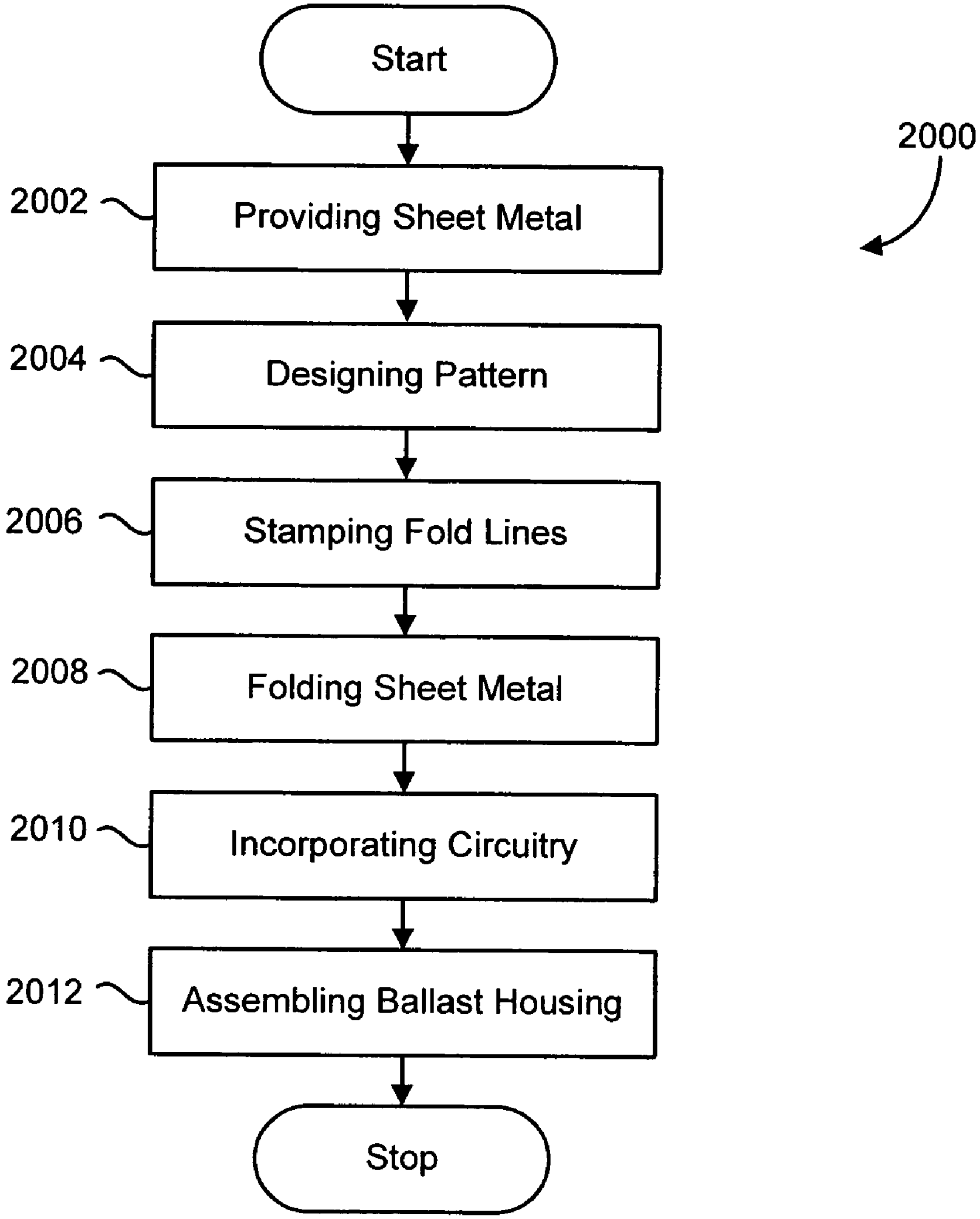
FIG. 20 illustrates a process flow diagram for an embodiment of the ballast housing of the present invention.

FIG. 20 illustrates one embodiment of a method 2000 for manufacturing the present ballast housing. In step 2002, a piece of sheet-like material is provided having an area sufficient to include the dimensions of any of the following: ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800.

In step 2004, a pattern of the layout for any of the ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800 is designed. These layout designs can be done by many different techniques, including actually marking the material with fold and cut lines or programming a computer implemented machine with the dimensions.

In step 2006, the material is stamped using commonly known techniques to create fold and cut lines on the material to facilitate the folding of the different surfaces of the ballast housing. In step 2008, the material is folded to form surfaces of the ballast housing 500, the housing bottom 502, housing top 204, top cover 700, ballast housing 900, additional top cover 1000, additional top cover 1200, ballast housing 1300, additional top cover 1402, additional top cover 1700, and metal cover 1800. These folds are generally to right angles of an adjacent surface as described herein, however, any desired angles of the folds can be produced. Additionally, these right angle bends provide easy attachments of the various components of the ballast housing by means of fasteners, such as screws or rivets. In step 2010, the desired electronic circuitry in incorporated into the ballast housing.

In step 2012, the ballast housing is assembled using fasteners, adhesives, or other types of fastening devices.

The following example is provided to further illustrate the preferred embodiments of the present ballast housing, but should not be construed as limiting the invention in any way.

EXAMPLE 1

Prior Art Ballast Housing

In this example, the ballast housing 200 includes a housing bottom 202 and housing top 204 that are attached together to form a housing that has the following dimensions: 5 inches in width, 6 inches in length, and 3.5 inches in height for a total surface area of approximately 137 square inches. The housing is made from extruded (or stamped) aluminum. From FIG. 3 it can be seen that 137 square inches of exposed surface area offers approximately 1.7° C./W thermal resistance in a natural convection environment. With the power devices mounted to the inside walls of the ballast housing (FIG. 2) the semiconductor junction to ballast case thermal resistance is approximately 1° C./W (0.6° C. for junction to device case+0.4° C. for interface material between the device case and the ballast surface). Based on these assumptions, the thermal resistance of semiconductor junction to ambient is 2.7° C./W. This total thermal resistance value times the power loss of 25 W, as stated above, means that the power devices within the ballast housing produces heat sufficient to raise the semiconductor junction temperature approximately an additional 67° C. Add to this the ambient temperature of 65° C., and they will cause the semiconductor junction temperature to rise over 132° C. Consequently, the ballast housing temperature will be approximately (1.7° C.×25 W+65° C.) 107.5° C.

EXAMPLE 2

Ballast Housing with Folded Fins and Undivided Ballast Circuitry

In this example, the ballast housing 1300 includes a housing bottom 502 and a housing top 702 and additional top cover 1000 that are attached together. The curved portions 502 and 506 of the housing bottom 502 are manufactured such that the spacing between the folded fin 504 and folded fin 510 is approximately 0.1 inches, and the spacing between folded fins 504 and housing bottom 502 is approximately 0.1 inches. The total overall height of the housing bottom 502 is approximately 2.2 inch. From FIG. 6, it can be seen that the folded fins 504 and 510 each will add an additional approximately 6.3 in length and 5 inches in width. The surface area available for convection includes: both planar sides of folded fins 504 and 510 is approximately 63 square inches. The overall housing bottom 502 convection surface area, including the folded fins 504 and 510 is approximately (78+63+63)=204 square inches. The surface area of the housing top 702 is 30 square inch. Therefore, the ballast housing 1300 will have an overall 234 square inch of convection surface area, which is a substantial increase over the prior art housing. The additional housing top cover 1000 includes folded fins 1008 that is attached to the top cover 702. Therefore in this example, the overall convection surface areas offered by additional top cover 1700 are approximately 2×(5 inches×6 inches+6 inches×2+6 inches×2)=108 square inch. As a result, the overall convection surface areas of the completed ballast housing 1300 is approximately (234+108)=342 square inches. The ballast housing 1300 is made from sheet-like aluminum having a thickness of 0.04 inches. From FIG. 3 it can be seen that 342 inches of surface area offers approximately 1° C./W thermal resistance in a natural convection environment. Therefore, using this value, the 25 W ballast loss and 65° C. ambient temperature will raise the semiconductor junction temperature to 115° C. This value is 17° C. less when compared with Example 1.

EXAMPLE 3

Ballast Housing with Folded Fins and Divided Ballast Circuitry

In this example, the ballast housing 1300 includes a housing bottom 502 and a housing top 702 and additional top cover 1700 that are attached together. The spacings and folded fins 504, 510, and 1008 have the same dimensions of Example 2 above. The ballast housing 1300 is made from sheet-like aluminum having a thickness of 0.04 inches. In this example, the dissipating semiconductor components, PCB 1702, are separated from PCB 206 as shown in FIG. 17. In this example, a 25 W ballast is separated into two distinct sections, namely, PCB 206 (17 W section) and PCB 1702 (8 W section), with the 17 W heat source housed in the ballast housing 1300. Therefore, the 17 W heat dissipating source with 204 square inch surface area will raise the junction temperature within the PCB 206 approximately ((2.4° C./W×17 W)+65° C.)=106° C. The other 8 W-heat dissipating source is mounted externally to the additional top cover 1700. The top cover 1700 has 108 square inch surface areas and a 2° C./W thermal resistance. Therefore, the junction temperature rise within the PCB 1702 will be approximately (3° C./W×8 W+65° C.) 89° C. However, when the top cover 1700 is attached to the ballast housing 1300, the overall junction temperature within the PCB 206 and PCB 1702 will attain a new average lower value of approximately 100° C. This is due to the fact that the thermal resistances of heat generating elements to the ballast housing acts in parallel.

The following temperature data (Table 1) is a summary of the above 3 examples based on actual experiments. All 3 cases the ambient temperature was 65° C.

TABLE 1

| Housing type | Semiconductor Junction Temp. | Housing temp. |
|---|---|---|
| Example 1 (3.5" × 5" × 6") | 130° C. | 104° C. |
| Example 2 | 112° C. | 89° C. |
| Example 3 | 99° C. | 85° C. |

Although there has been described what is at present considered to be the preferred embodiments of the present ballast housing, it will be understood that the ballast housing can be embodied in other specific forms without departing from the spirit or essential characteristics thereof. For example, additional means, such as conventional cooling fins, can be used in addition to the folded fins described herein. Further, the present ballast housing may be used for all types of lighting fixtures that use ballasts to power the lamps. Also, other manufacturing processes may be used other than those described herein without departing from the inventive novelty described herein. The present embodiments are, therefore, to be considered in all aspects as illustrative and not restrictive. The scope of the invention is indicated by the appended claims rather than the foregoing description.

What is claimed:

1. An enclosed electronic ballast housing comprising:

a housing bottom comprising:

a plurality of bottom side surfaces and a bottom surface to form said housing bottom;

at least one folded fin spaced apart from and substantially parallel to the surface axis of at least one of said plurality of bottom side surfaces and said bottom surface, said at least one folded fin being continuous through a curved portion with said at least one of said plurality of bottom side surfaces and said bottom surface, wherein said plurality of bottom side surfaces, said bottom surface, and said at least one folded fin are made from a sheet-like material; and a housing top comprising:

a plurality of top side surfaces and a top surface to form said housing top, wherein said plurality of top side surfaces and housing top is made from a sheet-like material.

2. The enclosed electronic ballast housing of claim 1 wherein said housing top further comprises:

an additional top cover comprising:

a main surface connected to said housing top;

at least one folded fin spaced apart from and substantially parallel to the surface axis of said main surface, said at least one folded fin being continuous through a curved portion with said main surface, wherein said main surface and said at least one folded fin are made from a sheet-like material.

3. The enclosed electronic ballast housing of claim 1 wherein said housing bottom is made from a single piece of sheet-like material.

4. The enclosed electronic ballast housing of claim 1 wherein said housing top is made from a single piece of sheet-like material.

5. The enclosed electronic ballast housing of claim 1 wherein said housing top encloses said housing bottom to seal said ballast housing.

6. The enclosed electronic ballast housing of claim 1 further including additional folded fins extending from said at least one folded fin.

7. The enclosed electronic ballast of claim 1 wherein said at least one folded fin ends in a mounting flange for securing said enclosed electronic ballast housing to a lighting fixture.

8. The enclosed electronic ballast housing of claim 1 wherein said housing bottom has dimensions that fit into the footprint of an existing lighting fixture ballast.

9. The enclosed electronic ballast housing of claim 1 wherein said at least one folded fin is located between said housing bottom and a lighting fixture when said enclosed electronic ballast housing is secured to said lighting fixture.

10. The enclosed electronic ballast housing of claim 1 wherein said sheet-like material has a thickness of from about 0.01 inches to about 0.30 inches.

11. The enclosed electronic ballast housing of claim 1 wherein said sheet-like material has a thickness of from about 0.01 inches to about 0.06 inches.

12. The enclosed electronic ballast housing of claim 1 wherein said sheet-like material has a thickness of 0.04 inches.

13. The enclosed electronic ballast housing of claim 1 wherein said sheet-like material is a heat conducting material selected from the group consisting metals, metal compounds, metal alloys, plastics, thermoplastics, polymers and copolymers.

14. The enclosed electronic ballast housing of claim 1 wherein said sheet-like material is selected from the group consisting of aluminum and copper.

15. The enclosed electronic ballast housing of claim 1 wherein said at least one folded fin is arranged in an accordion-style fin arrangement.

16. The enclosed electronic ballast housing of claim 2 wherein said at least one folded fin has a corrugated cross-section.

17. An enclosed electronic ballast for a lighting fixture for powering a lamp comprising:

a housing bottom comprising:

a plurality of bottom side surfaces and a bottom surface to form said housing bottom;

at least one folded fin spaced apart from and substantially parallel to the surface axis of at least one of said plurality of bottom side surfaces and said bottom surface, said at least one folded fin being continuous through a curved portion with said at least one of said plurality of bottom side surfaces and said bottom surface, wherein said plurality of bottom side surfaces, said bottom surface, and said at least one folded fin are made from a sheet-like material;

a first part of electronic circuitry located within said housing bottom for converting AC to low frequency power to supply said lamp;

a housing top comprising:

a plurality of top side surfaces and a top surface to form said housing top, wherein said plurality of top side surfaces housing top is made from a sheet-like material; and an additional top cover attached to said housing top comprising:

a main surface attached to said housing top;

at least one folded fin spaced apart from and substantially parallel to the surface axis of said main surface, said at least one folded fin being continuous through a curved portion with said main surface, wherein said main surface and said at least one folded fin are made from a sheet-like material; and a second part of electronic circuitry located on said additional top cover and connected through a wiring assembly to said first part of electronic circuitry.

18. The enclosed electronic ballast for a lighting fixture of claim 17 wherein said housing bottom is made from a single piece of sheet-like material.

19. The enclosed electronic ballast for a lighting fixture of claim 17 wherein said housing top is made from a single piece of sheet-like material.

20. The enclosed electronic ballast for a lighting fixture of claim 17 wherein said at least one folded fin ends in a mounting flange for securing said enclosed electronic ballast housing to a lighting fixture.

21. The enclosed electronic ballast for a lighting fixture of claim 17 wherein said sheet-like material has a thickness of from about 0.01 inches to about 0.30 inches.

22. The enclosed electronic ballast for a lighting fixture of claim 17 wherein said sheet-like material has a thickness of from about 0.01 inches to about 0.06 inches.

23. The enclosed electronic ballast for a lighting fixture of claim 17 wherein said sheet-like material has a thickness of 0.04 inches.

24. The enclosed electronic ballast for a lighting fixture claim 17 wherein said sheet-like material is a heat conducting material selected from the group consisting metals, metal compounds, metal alloys, plastics, thermoplastics, polymers and copolymers.

25. The enclosed electronic ballast for a lighting fixture of claim 17 wherein said sheet-like material is selected from the group consisting of aluminum and copper.

26. A method for manufacturing an enclosed electronic ballast housing comprising:

providing a piece of sheet metal having an area sufficient to include the dimensions of a housing bottom of said enclosed electronic ballast housing;

stamping fold lines and cut openings comprising a pattern including dimensions and shapes of a plurality of bottom side surfaces, bottom surface, and at least one folded fin of said housing bottom of said enclosed electronic ballast housing into said piece of sheet metal;

folding, at said fold lines, said piece of sheet metal to form said plurality of bottom side surfaces, bottom surface, and said at least one folded fin; and joining said plurality of bottom side surfaces, bottom surface, and said at least one folded fin to form said housing bottom of said enclosed electronic ballast housing.

27. The method for manufacturing an enclosed electronic ballast housing of claim 26 further comprising:

providing a piece of sheet metal having an area sufficient to include the dimensions of a housing top of said enclosed electronic ballast housing;

stamping fold lines and cut openings comprising a pattern including dimensions and shapes of a plurality of top side surfaces and a top surface of said housing top of said enclosed electronic ballast housing into said piece of sheet metal;

folding, at said fold lines, said piece of sheet metal to form said plurality of top side surfaces and a top surface; and joining said plurality of top side surfaces and a top surface of said housing top of said enclosed electronic ballast housing.

28. The method for manufacturing an enclosed electronic ballast housing of claim 26 further comprising:

incorporating circuitry into said housing bottom.

29. The method for manufacturing an enclosed electronic ballast housing of claim 26 further comprising:

joining together said housing bottom and said housing top to form said enclosed electronic ballast housing.

30. The method for manufacturing an enclosed electronic ballast housing of claim 26 wherein said sheet metal is selected from the group consisting of aluminum and copper.

31. The method for manufacturing an enclosed electronic ballast housing of claim 27 further comprising:

providing a piece of sheet metal having an area sufficient to include the dimensions of an additional top cover of said enclosed electronic ballast housing;

stamping fold lines and cut openings comprising a pattern including dimensions and shapes of at least one folded fin and a top surface of said additional top cover of said enclosed electronic ballast housing into said piece of sheet metal;

folding, at said fold lines, said piece of sheet metal to form said at least one folded fin and a top surface; and joining said additional top cover to said housing top of said enclosed electronic ballast housing.

32. The method for manufacturing an enclosed electronic ballast housing of claim 31 further comprising:

incorporating a portion of a circuitry into said additional top cover; and connecting said portion of circuitry with a primary circuitry.

* * * * *